US009801302B2

(12) United States Patent
Huang et al.

(10) Patent No.: US 9,801,302 B2
(45) Date of Patent: Oct. 24, 2017

(54) EQUIPMENT CABINET AND SLIDABLE-AND-ROTATABLE RACK ASSEMBLY THEREOF

(71) Applicant: DELTA ELECTRONICS, INC., Taoyuan Hsien (TW)

(72) Inventors: Yen-Wen Huang, Taoyuan Hsien (TW); Kuan-Lung Wu, Taoyuan Hsien (TW); Chia-Hui Chen, Taoyuan Hsien (TW)

(73) Assignee: DELTA ELECTRONICS, INC., Taoyuan Hsien (TW)

( * ) Notice: Subject to any disclaimer, the term of this patent is extended or adjusted under 35 U.S.C. 154(b) by 48 days.

(21) Appl. No.: 14/873,804

(22) Filed: Oct. 2, 2015

(65) Prior Publication Data

US 2017/0020025 A1  Jan. 19, 2017

Related U.S. Application Data

(60) Provisional application No. 62/193,775, filed on Jul. 17, 2015.

(51) Int. Cl.
| H05K 5/00 | (2006.01) |
| H05K 7/18 | (2006.01) |
| H05K 7/14 | (2006.01) |
| G06F 1/18 | (2006.01) |
| H05K 5/02 | (2006.01) |

(52) U.S. Cl.
CPC ............. *H05K 7/186* (2013.01); *G06F 1/187* (2013.01); *H05K 5/0217* (2013.01); *H05K 7/1411* (2013.01); *H05K 7/1422* (2013.01); *H05K 7/1489* (2013.01); *H05K 7/183* (2013.01)

(58) Field of Classification Search
CPC .... H05K 7/1411; H05K 7/186; H05K 5/0217; H05K 7/1422; H05K 7/1489; H05K 7/183; G06F 1/187
USPC ............... 361/724, 725, 726, 727, 755, 756; 312/223.2, 223.3
See application file for complete search history.

(56) References Cited

U.S. PATENT DOCUMENTS 8,226,181 B2 * 7/2012 Du ...................... H05K 7/1489
211/26

FOREIGN PATENT DOCUMENTS

DE          2131772 A1 * 11/1972  ............... H02B 1/30
IT   WO 2008056384 A1 * 5/2008  ............. H02B 1/303

* cited by examiner

*Primary Examiner* — James Wu
(74) *Attorney, Agent, or Firm* — Kirton McConkie; Evan R. Witt

(57) ABSTRACT

An equipment cabinet and a slidable-and-rotatable rack assembly are provided. The equipment cabinet includes a housing and a rack assembly. The rack assembly is disposed in the receiving space of the housing. The rack assembly comprises a first slidable tray, at least two first rail assemblies, a frame, and a first rotation shaft assembly. The first rail assemblies are connected with the first slidable tray and the housing respectively and configured for allowing the first slidable tray to be moved relative to the housing. The frame is carried by the first slidable tray and has a base plate. The first rotation shaft assembly is coupled with the base plate of the frame and the first slidable tray and configured for allowing the frame to be rotated relative to the first slidable tray after the frame carried by the first slidable tray is drawn out.

22 Claims, 27 Drawing Sheets

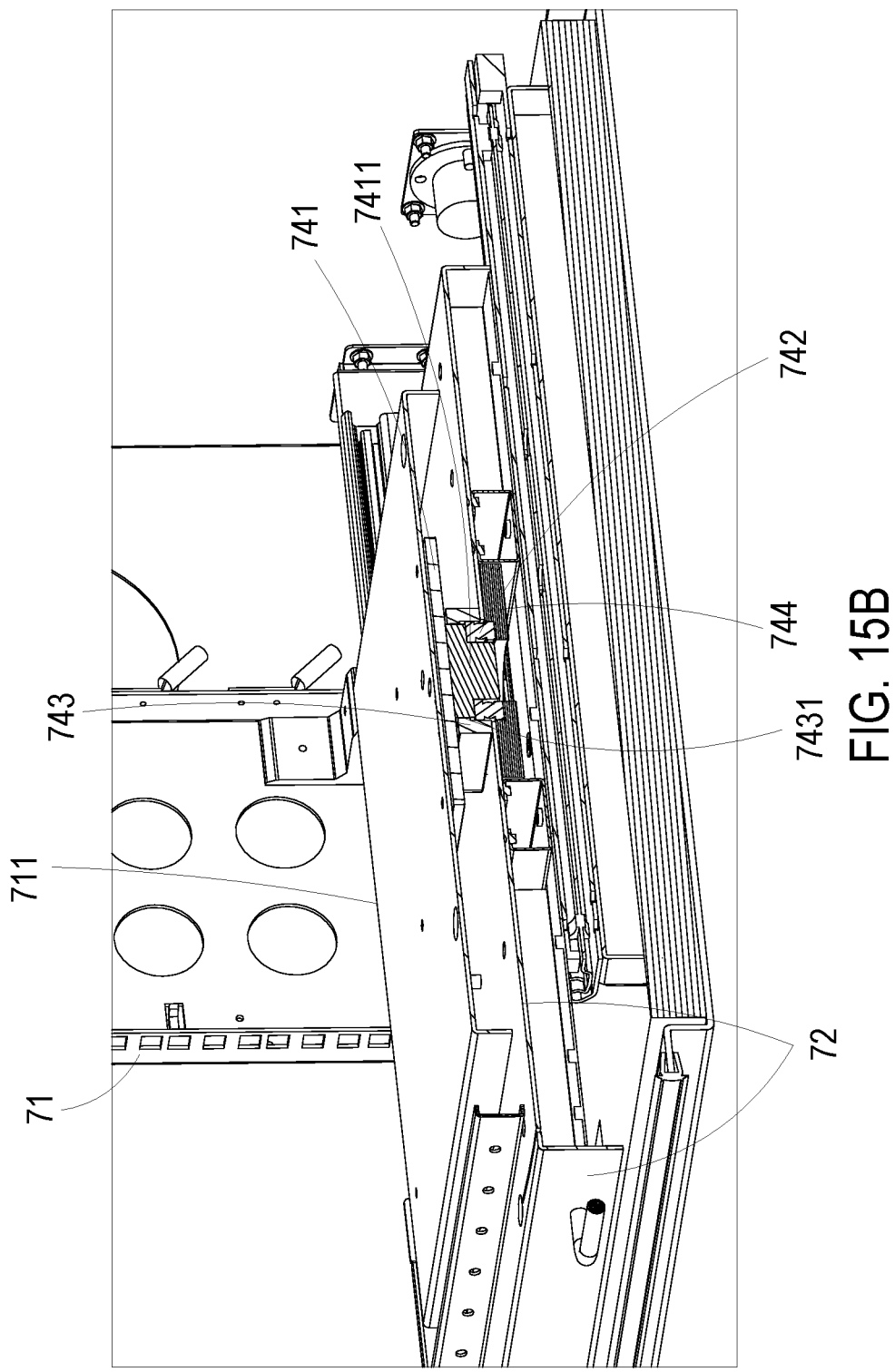

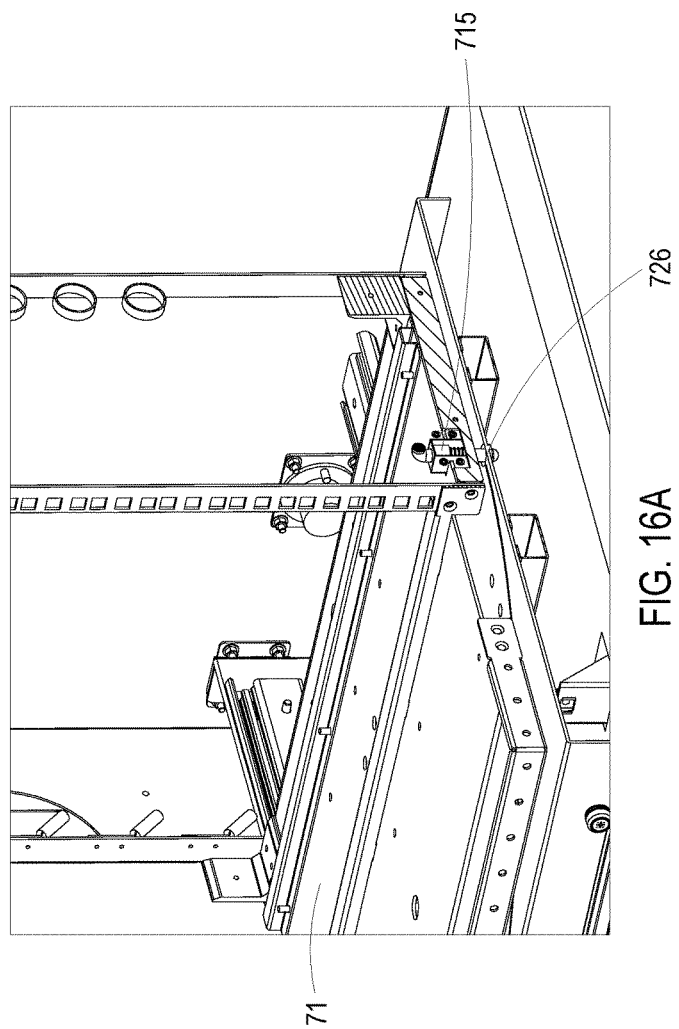

EQUIPMENT CABINET AND SLIDABLE-AND-ROTATABLE RACK ASSEMBLY THEREOF

CROSS-REFERENCE TO RELATED APPLICATION

This application claims the benefit of U.S. Provisional Application No. 62/193,775 filed on Jul. 17, 2015, and entitled "EQUIPMENT CABINET AND SLIDABLE-AND-ROTATABLE RACK ASSEMBLY THEREOF", the entirety of which is hereby incorporated by reference.

FIELD OF THE INVENTION

The present invention relates to a cabinet, and more particularly to an equipment cabinet and a slidable-and-rotatable rack assembly thereof.

BACKGROUND OF THE INVENTION

With increasing development of information industries and networks, the services provided through networks are becoming more and more popular in various applications. For providing intensive network applications, it is needed to employ a great deal of telecommunication equipment to transmit, process and access data. Typically, the telecommunication equipment as well as power supply equipment can be mounted inside an equipment cabinet for protecting the components of the equipment from external influences.

The equipment cabinet has plural compartments for accommodating the telecommunication equipment and the power supply equipment. To facilitate access to the individual equipment for maintenance, repairs and/or upgrades, the equipment is detachably secured to a rack assembly inside the equipment cabinet. Generally, after the telecommunication equipment and the power supply equipment are installed within the rack assembly of the equipment cabinet, a plurality of cables or wires are routed to connect with the power supply equipment and the telecommunication equipment at the rear of the equipment cabinet. However, there has no sufficient space for a technician to remove the rear panel of the equipment cabinet and then route the cables or wires to connect with the equipment at the rear of the equipment cabinet. For example, in a case that the regular maintenance of the telecommunication equipment and the power supply equipment is made, since the available space at the rear of the equipment cabinet is usually insufficient, the equipment cabinet should be shifted or moved to a location with sufficient space for allowing the technician to detach the rear panel of the equipment cabinet and disconnect the cables or wires from the equipment. Until the cables or wires are disconnected from the equipment, the technician can draw out the equipment at the front of the equipment cabinet so as to perform the maintenance tasks. Under this circumstances, it is inconvenient and time-consuming to perform the operations of routing the cables or wires to connect with the equipment or disconnecting the cables or wires from the equipment. Moreover, if wall-mount equipment cabinets are employed, such space requirements are impracticable or impossible for the wall-mount equipment cabinets to achieve the operations of routing the cables or wires to connect with the equipment or disconnecting the cables or wires from the equipment.

Therefore, there is a need of providing an improved equipment cabinet to obviate the drawbacks encountered from the prior arts.

SUMMARY OF THE INVENTION

It is an object of the present invention to provide an equipment cabinet with a slidable-and-rotatable rack assembly for allowing the mounted equipment to be drawn out and rotated, so that the rear of the mounted equipment can be rotated toward the front of the equipment cabinet, and the operations of routing the cables or wires to connect with the mounted equipment or disconnecting the cables or wires from the mounted equipment can be performed at the front of the equipment cabinet without removing the rear panel of the equipment cabinet. Consequently, it is labor-saving and time-saving to install and maintain the equipment of the equipment cabinet.

It is another object of the present invention to provide a wall-mount telecommunication equipment cabinet for allowing a technician to route the cables or wires to connect the mounted equipment of the equipment cabinet at the front of the equipment cabinet.

In accordance with an aspect of the present invention, an equipment cabinet is provided. The equipment cabinet includes a housing and a rack assembly. The rack assembly is disposed in the receiving space of the housing. The rack assembly comprises a first slidable tray, at least two first rail assemblies, a frame, and a first rotation shaft assembly. The first rail assemblies are connected with the first slidable tray and the housing respectively and configured for allowing the first slidable tray to be moved relative to the housing. The frame is carried by the first slidable tray and has a base plate. The first rotation shaft assembly is coupled with the base plate of the frame and the first slidable tray and configured for allowing the frame to be rotated relative to the first slidable tray after the frame carried by the first slidable tray is drawn out.

In accordance with another aspect of the present invention, a slidable-and-rotatable rack assembly for an equipment cabinet is provided. The equipment cabinet includes a housing. The slidable-and-rotatable rack assembly is disposed in the receiving space of the housing. The rack assembly comprises a first slidable tray, at least two first rail assemblies, a frame, and a first rotation shaft assembly. The first rail assemblies are connected with the first slidable tray and the housing respectively and configured for allowing the first slidable tray to be moved relative to the housing. The frame is carried by the first slidable tray and has a base plate. The first rotation shaft assembly is coupled with the base plate of the frame and the first slidable tray and configured for allowing the frame to be rotated relative to the first slidable tray after the frame carried by the first slidable tray is drawn out.

The above contents of the present invention will become more readily apparent to those ordinarily skilled in the art after reviewing the following detailed description and accompanying drawings, in which:

BRIEF DESCRIPTION OF THE DRAWINGS

FIG. 15B is a partially cross-sectional view showing the first rotation shaft assembly, the frame and the first slidable tray of FIG. 13;

FIGS. 16A and 16B are partially cross-sectional views showing the auto-latch mechanism of FIG. 13.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
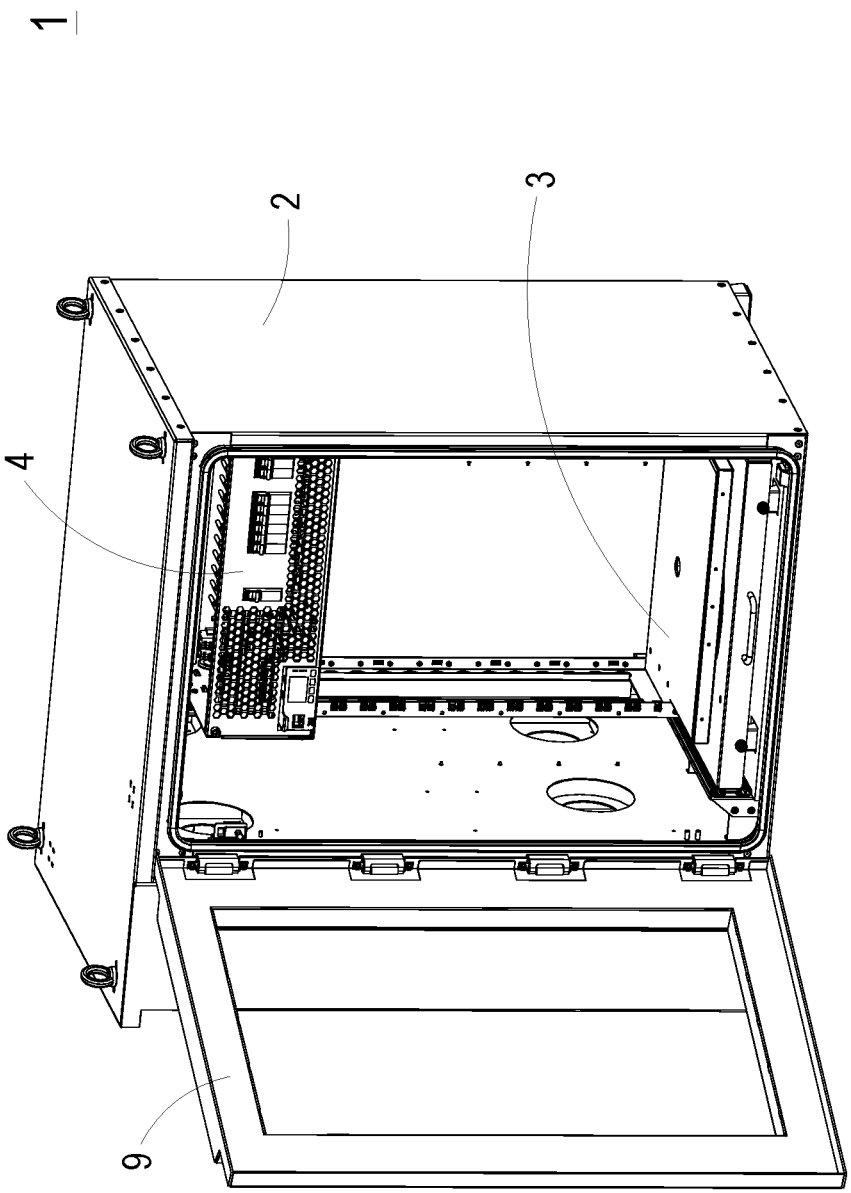
FIG. 1 is a schematic perspective view illustrating an equipment cabinet according to a first embodiment of the present invention.
Figure 2:
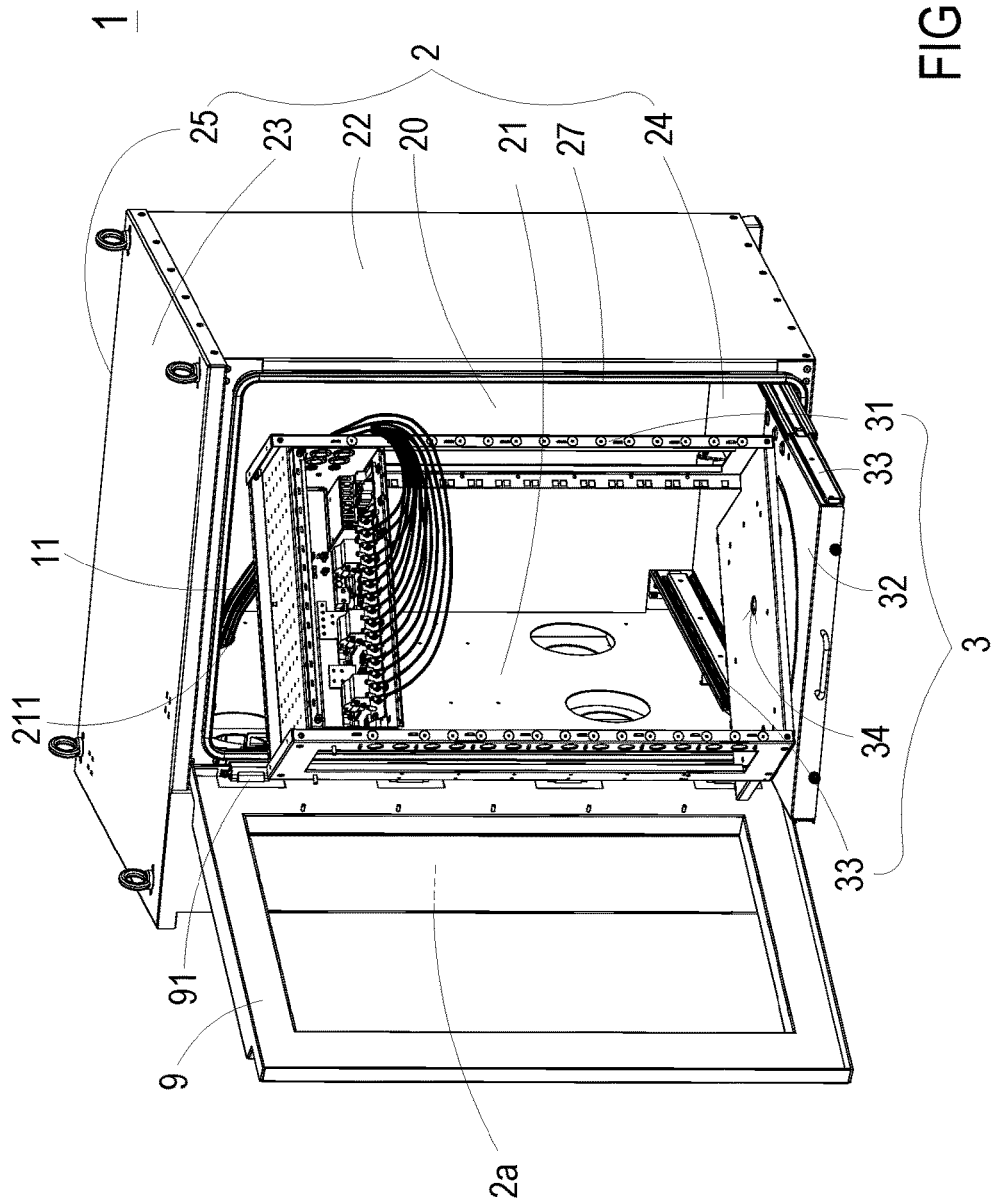
FIG. 2 is a perspective view of the equipment cabinet of FIG. 1 showing the equipment mounted in the rack assembly to be drawn out and rotated for wires routed rear access.
Figure 3:
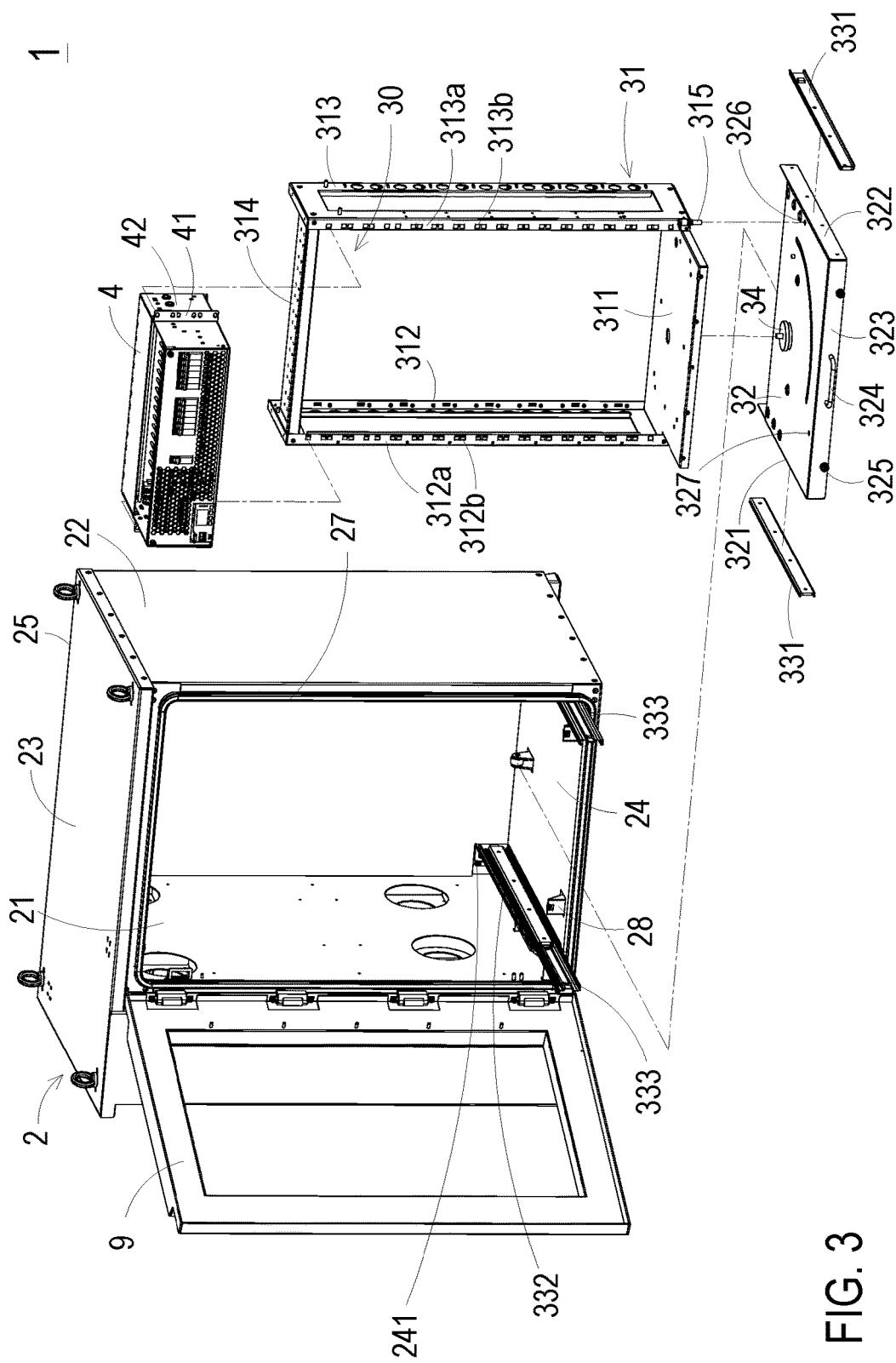
FIG. 3 is an exploded view of the rack assembly, the housing and the equipment of FIG. 2.

FIG. 1 is a schematic perspective view illustrating an equipment cabinet according to a first embodiment of the present invention, FIG. 2 is a perspective view of the equipment cabinet of FIG. 1 showing the equipment mounted in the rack assembly to be drawn out and rotated for wires routed rear access, and FIG. 3 is an exploded view of the rack assembly, the housing and the equipment of FIG. 2. As shown in FIGS. 1, 2 and 3, the equipment cabinet 1 is a telecommunication equipment cabinet. Preferably but not exclusively, the equipment cabinet 1 is a wall-mount telecommunication equipment cabinet. The equipment cabinet 1 comprises a housing 2, a slidable-and-rotatable rack assembly 3 (hereinafter referred as rack assembly), and a door 9. The housing 2 has a first lateral panel 21, a second lateral panel 22 opposite to the first lateral panel 21, a top panel 23, a bottom panel 24 opposite to the top panel 23, and a rear panel 25. The housing 2 further comprises an opening 27 and a receiving space 20 defined by the first lateral panel 21, the second lateral panel 22, the top panel 23, the bottom panel 24 and the rear panel 25. The door 9 is pivotally coupled with the housing 2 via a rotation shaft 91 and disposed at a location close to the first lateral panel 21 and opposite to the rear panel 25. The door 9 can be selectively opened or closed for covering the opening 27, so that one or more equipment 4 can be installed or accessed at the front of the equipment cabinet 1 when the door 9 is opened. In this embodiment, the housing 2 further includes an accommodation room 2a disposed close to the receiving space 20 for mounting a circuit board and receiving a plurality of cables or wires 11 therein. The accommodation room 2a and the receiving space 20 are isolated with each other by the first lateral panel 21. The first lateral panel 21 has at least one through hole 211 for allowing the cables or wires 11 to be routed from the accommodation room 2a to the receiving space 20. The rack assembly 3 is disposed in the receiving space 20 of the housing 2 and has plural compartments 30 for accommodating and installing one or more equipment 4, for example telecommunication equipment and the power supply equipment. In an embodiment, at least one power distribution unit, a plurality of power modules, and a plurality of telecommunication equipment are accommodated in the compartments 30 of the rack assembly 3 of the equipment cabinet 1. Examples of the telecommunication equipment includes but not limited to network switcher, router, or any other computing and communication device.

Please refer to FIGS. 1, 2, and 3, again. The rack assembly 3 is disposed in the interior of the housing 2 and can be drawn out and rotated for facilitating operations of routing the cables or wires 11 to connect with corresponding sockets or connection ports of the equipment 4 at the front of the equipment cabinet 1, wherein the sockets or connection ports are disposed on the rear of the equipment 4. The rack assembly 3 comprises a frame 31, a first slidable tray 32 (i.e. first movable carrier), at least two first rail assemblies 33, and a first rotation shaft assembly 34 (i.e. first rotation disc assembly). The frame 31 includes a base plate 311, a first vertical plate 312, a second vertical plate 313 and a top plate 314. The first ends of the first vertical plate 312 and the second vertical plate 313 are connected with two sides of the top plate 314, respectively, and the second ends of the first vertical plate 312 and the second vertical plate 313 are connected with two sides of the base plate 311, respectively. The first vertical plate 312 and the second vertical plate 313 are spaced apart and parallel with each other. Plural compartments 30 are formed in space defined by the base plate 311, the first vertical plate 312, the second vertical plate 313 and the top plate 314 for accommodating and installing one or more equipment 4. In an embodiment, each of the first vertical plate 312 and the second vertical plate 313 has a mounting surface 312a, 313a, wherein the mounting surface 312a, 313a has a plurality of fixing holes 312b, 313b arranged thereon. The fixing holes 312b are spaced apart with a specific distance, and the fixing holes 313b are spaced apart with a specific distance. When the equipment 4 are installed into the compartments 30 of the rack assembly 3, the brackets 41 of the equipment 4 can be secured to the mounting surfaces 312*a*, 313*a* of the first vertical plate 312 and the second vertical plate 313 by using screws (not shown) to screwing into the fixing holes 42 on the brackets 41 and the corresponding fixing holes 312*b*, 313*b* on the first vertical plate 312 and the second vertical plate 313. Consequently, the equipment 4 can be securely fixed to frame 31 of the rack assembly 3.

Figure 4A:
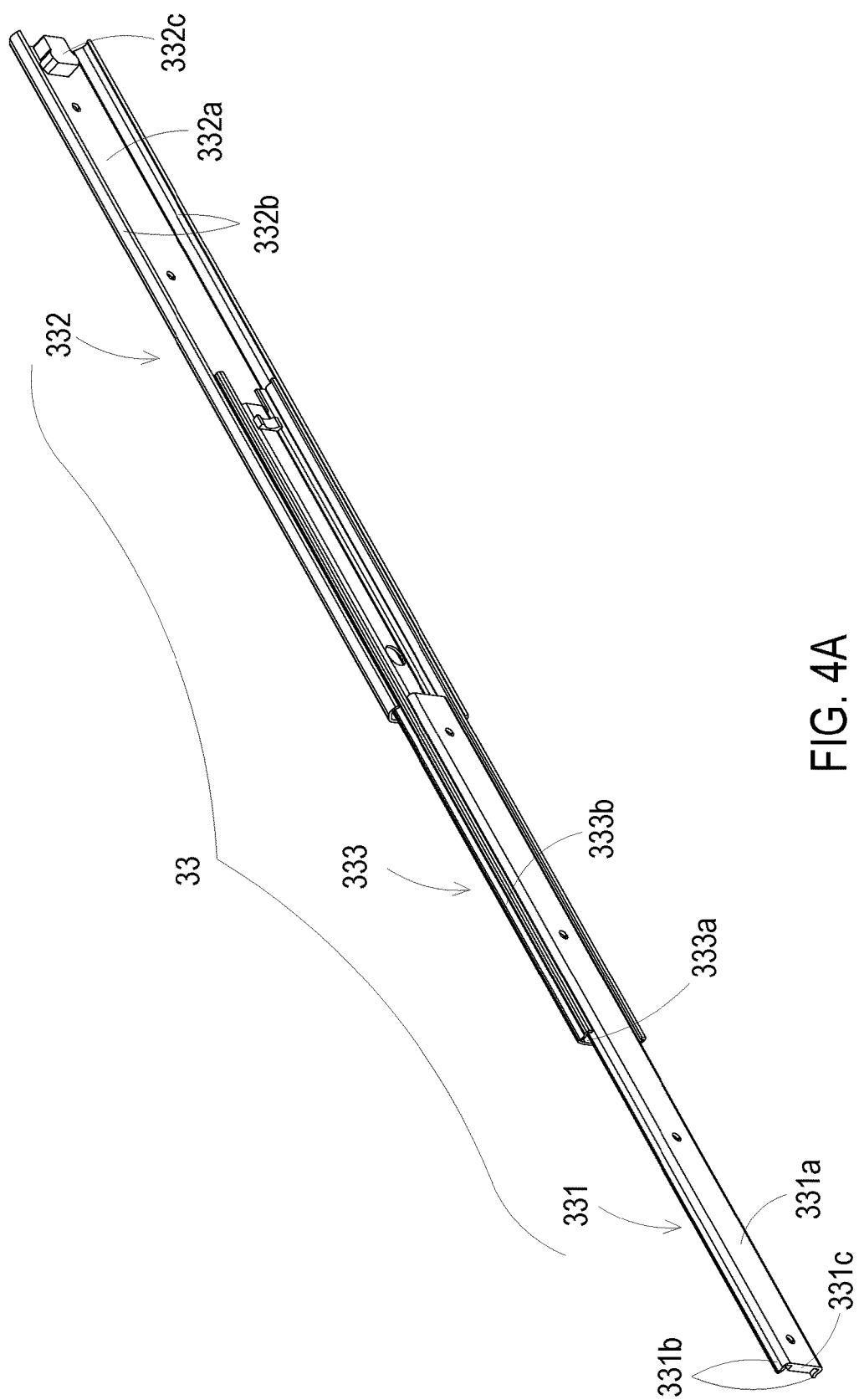
FIG. 4A is a schematic perspective view of the first rail assembly of FIG. 3.
Figure 4B:
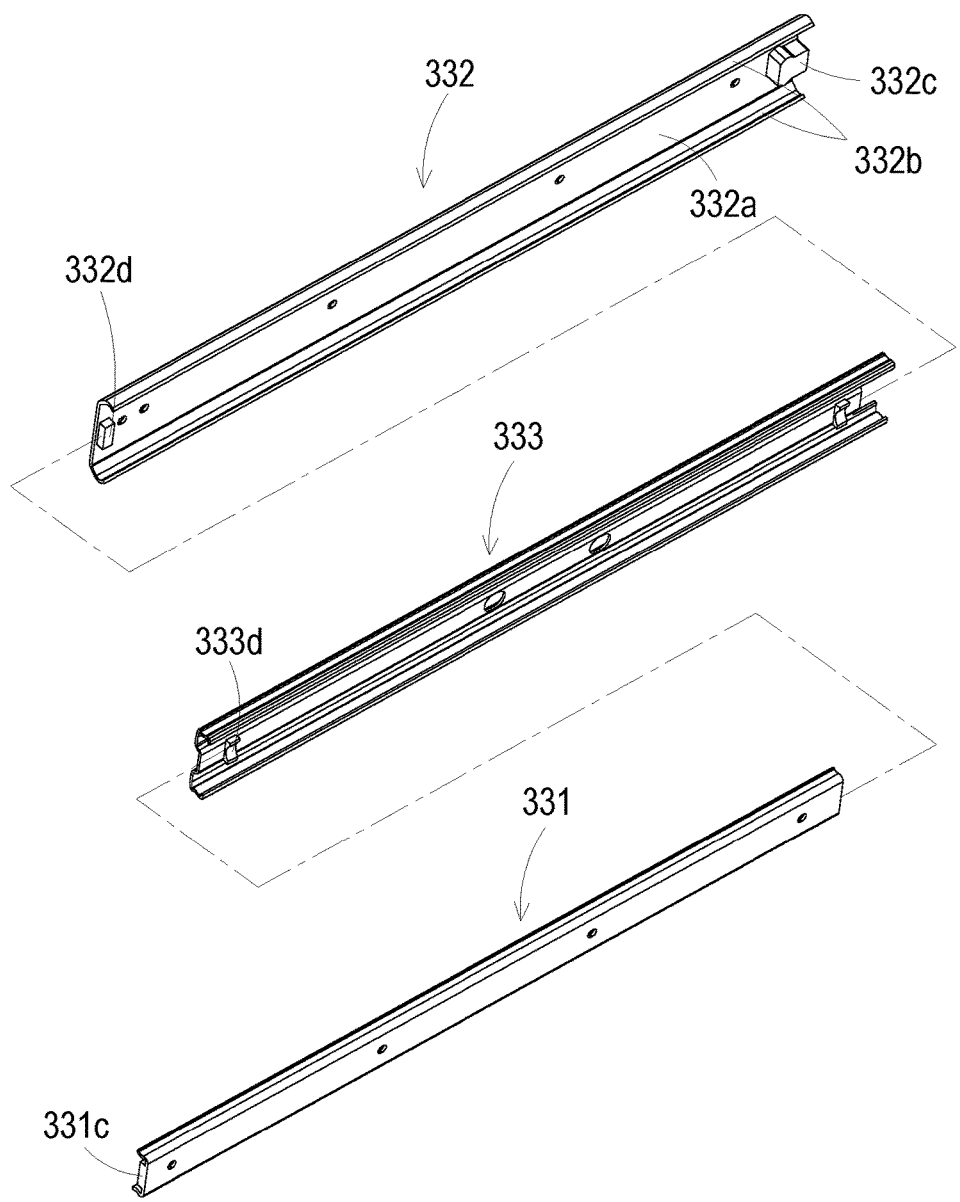
FIGS. 4B and 4C are exploded views showing the inner rail, the outer rail and the slide coupler of FIG. 4A.
Figure 4C:
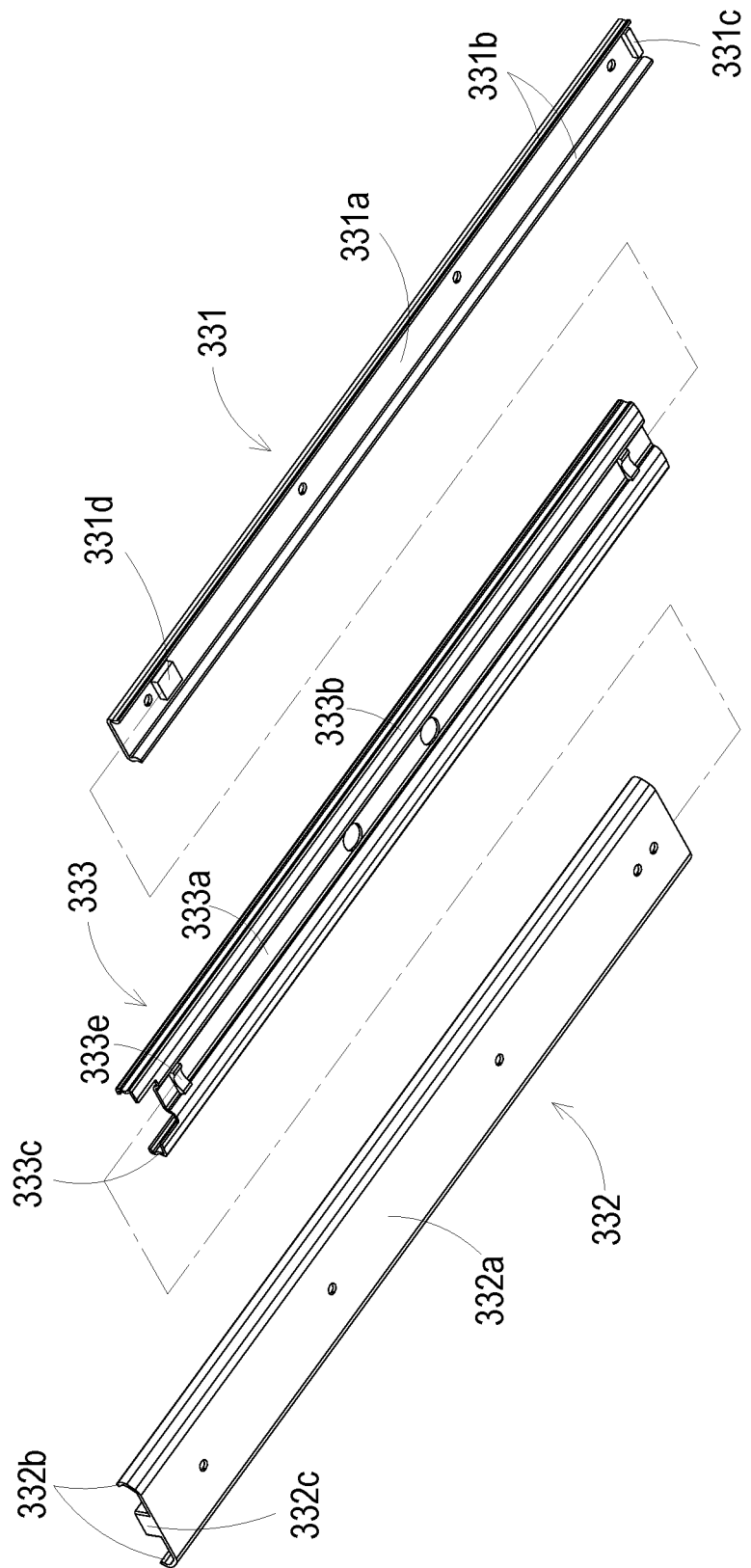
Figure 4D:
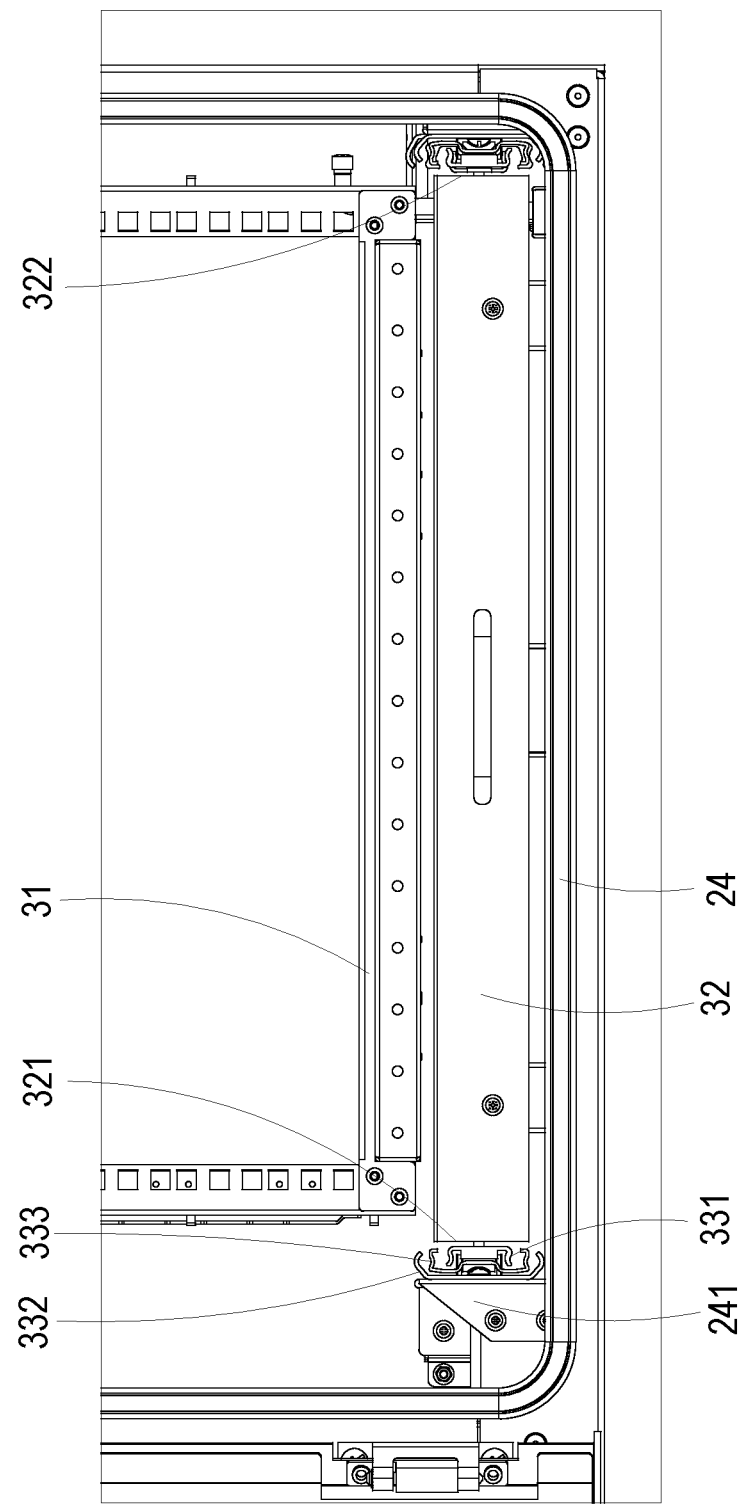
FIG. 4D is a schematic perspective view showing two first rail assemblies, the first slidable tray and the first supporting bracket of FIG. 3.

FIG. 4A is a schematic perspective view of the first rail assembly of FIG. 3, FIGS. 4B and 4C are exploded views showing the inner rail, the outer rail and the slide coupler of FIG. 4A, and FIG. 4D is a schematic perspective view showing two first rail assemblies, the first slidable tray and the first supporting bracket of FIG. 3. As shown in FIGS. 3, 4A, 4B, 4C, and 4D, each first rail assembly 33 is a telescopic rail assembly. Preferably, the first rail assembly 33 is a steel telescopic rail assembly. The first rail assembly 33 includes an inner rail 331, an outer rail 332 and a slide coupler 333. The inner rails 331 of the two first rail assemblies 33 are firmly mounted on a first side 321 and a second side 322 of the first slidable tray 32, respectively, wherein the second side 322 is opposite to the first side 321. Namely, the inner rails 331 are stationary rails relative to the first slidable tray 32. The housing 2 further comprises one or more first supporting bracket 241 disposed on the inner surface of the bottom panel 24 of the housing 2. In this embodiment, two first supporting brackets 241 are disposed on the inner surface of the bottom panel 24 and evenly spaced apart and parallel with each other. The outer rails 332 of the two first rail assemblies 33 are firmly mounted on the two first supporting brackets 241, respectively. Namely, the outer rails 332 are stationary rails with respective to the bottom panel 24 of the housing 2. Alternatively, the outer rails 332 of the two first rail assemblies 33 are firmly and directly mounted on the first lateral panel 21 and the second lateral panel 22 of the housing 2, respectively. Alternatively, one of the outer rails 332 is firmly and directly mounted on the first lateral panel 21 of the housing 2, and the other of the outer rails 332 is firmly mounted on the first supporting bracket 241. Alternatively, one of the outer rails 332 is firmly and directly mounted on the second lateral panel 22 of the housing 2, and the other of the outer rails 332 is firmly mounted on the first supporting bracket 241.

The slide coupler 333 is connected with the outer rail 332 and the inner rail 331, disposed between the outer rail 332 and the inner rail 331 and slidable relative to the outer rail 332 and the inner rail 331. Namely, the slide coupler 333 is inserted into the accommodation space of the outer rail 332, and the slide coupler 333 is slidable within the accommodation space of the outer rail 332 in a longitudinal direction. The inner rail 331 is inserted into the accommodation space of the slide coupler 333, and the inner rail 331 is slidable within the accommodation space of the slide coupler 333 in a longitudinal direction. The inner rail 331 has a first transverse plate 331*a*, two lateral flanges 331*b*, a first stopper 331*c* and a second stopper 331*d*. The two lateral flanges 331*b* are disposed at two opposite transverse side edges of the first transverse plate 331*a*, and the first stopper 331*c* and the second stopper 331*d* are disposed at two opposite ends of the first transverse plate 331*a*. Preferably, the inner rail 331 has an essentially U-shaped cross-section. The outer rail 332 has a second transverse plate 332*a*, two lateral arms 332*b*, a third stopper 332*c* and a fourth stopper 332*d*. The two lateral arms 332*b* are disposed at two opposite transverse side edges of the second transverse plate 332*a*, and the third stopper 332*c* and the fourth stopper 332*d* are disposed at two opposite ends of the second transverse plate 332*a*. Preferably, the outer rail 332 has an essentially C-shaped cross-section. The slide coupler 333 has a third transverse plate 333*a*, two curved protrusion parts 333*b*, two slots 333*c*, a fifth stopper 333*d* and a sixth stopper 333*e*. The two curved protrusion parts 333*b* are disposed at two opposite transverse side edges of the third transverse plate 333*a*, the two slots 333*c* are disposed at the accommodation space of the slide coupler 333 and corresponding to the two curved protrusion parts 333*b*, respectively. The fifth stopper 333*d* and the sixth stopper 333*e* are disposed at two ends of the third transverse plate 332*a*. When the inner rail 331, the outer rail 332 and the slide coupler 333 are assembled together, the inner rail 331 is inserted into the slide coupler 333, and the two flanges 331*b* of the inner rail 331 are received within the two slot 333*c* of the slide coupler 333. In addition, the slide coupler 333 is inserted into the outer rail 332, and the two curved protrusion parts 333*b* of the slide coupler 333 are corresponding to the two arms 332*b* of the outer rail 332. The fifth stopper 333*d* of the slide coupler 333 is disposed between the first stopper 331*c* and the second stopper 331*d* of the inner rail 331, so that the movement between the inner rail 331 and the slide coupler 333 can be limited. The sixth stopper 333*e* of the slide coupler 333 is disposed between the third stopper 332*c* and the fourth stopper 332*d* of the outer rail 332, so that the movement between the outer rail 332 and the slide coupler 333 can be limited. Consequently, the first slidable tray 32 can slide out from the interior of the housing 2 and carry the frame 31 to move correspondingly by using the first rail assemblies 33. In this embodiment, the two rail assemblies 33 are configured to guide and support the first slidable tray 32 at two opposite sides, so that the operations of drawing the frame 31 out of the interior of the housing 2 can be performed more stably, and the shift or displacement of the frame 31 can be prevented.

Figure 5A:
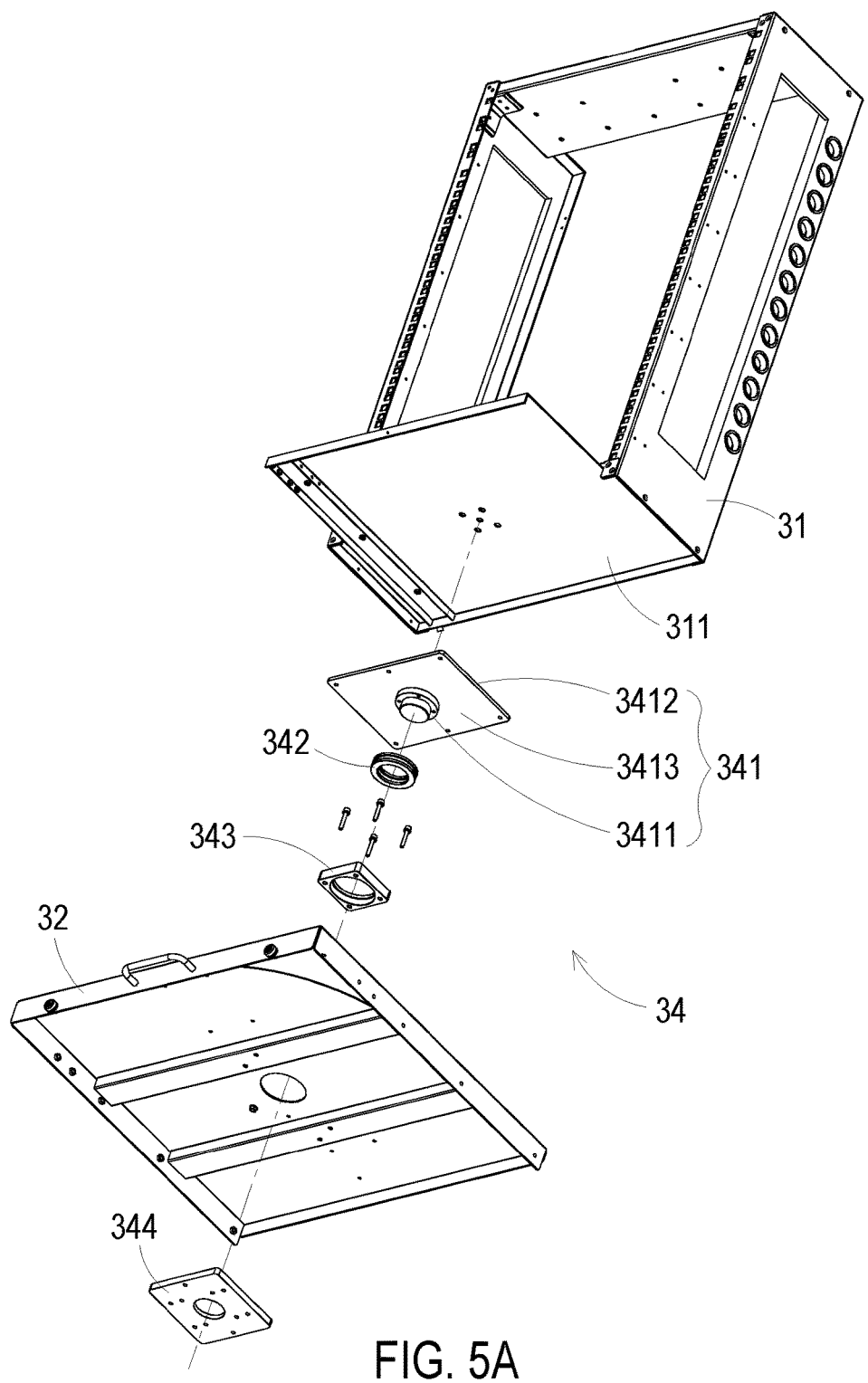
FIG. 5A is an exploded view of the first rotation shaft assembly, the frame and the first slidable tray of FIG. 3.
Figure 5B:
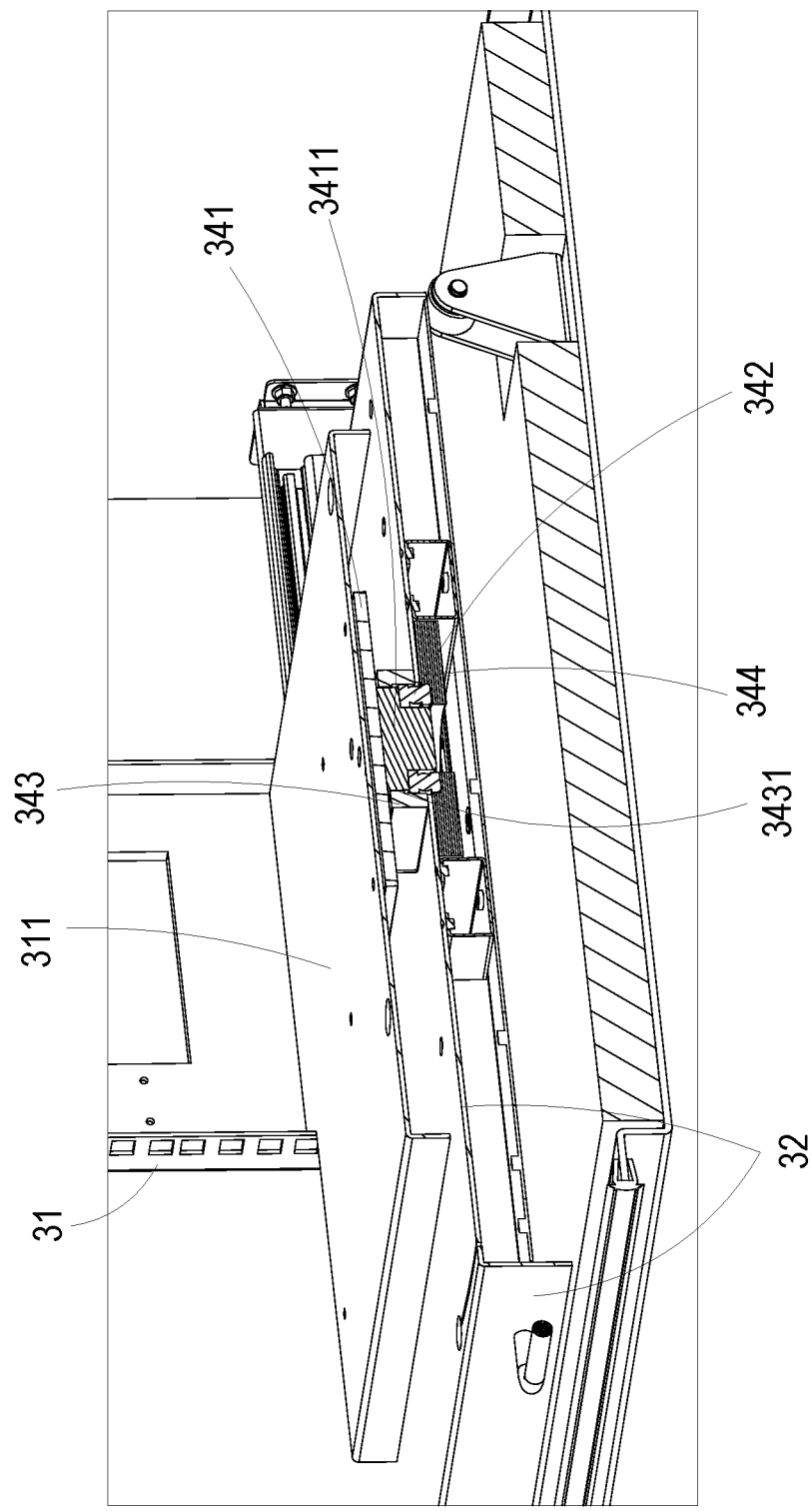
FIG. 5B is a partially cross-sectional view showing the first rotation shaft assembly, the frame and the first slidable tray of FIG. 3.

FIG. 5A is an exploded view of the first rotation shaft assembly and frame of FIG. 3, and FIG. 5B is a partially cross-sectional view showing the first rotation shaft assembly, the frame and the first slidable tray of FIG. 3. As shown in FIGS. 3, 5A and 5B, the first rotation shaft assembly 34 is coupled with the base plate 311 of the frame 31 and the first slidable tray 32 on the middle of the base plate 311 and the first slidable tray 32, so that the frame 31 can be rotated relative to the first slidable tray 32 by using the first rotation shaft assembly 34. Preferably but not exclusively, the first rotation shaft assembly 34 is aligned with the middle of the mounted equipment 4 so as to shorten the rotation radius and gain more space for maintenance. The first rotation shaft assembly 34 includes a connection part 341, a rolling element 342, and a rotation disc base 343. The connection part 341 has a shaft 3411, a first surface 3412 and a second surface 3413. The connection part 341 is firmly mounted on the base plate 311 of the frame 31, wherein the first surface 3412 of the connection part 341 is face to the base plate 311 of the frame 31. The shaft 3411 is disposed on the second surface 3413 of the connection part 341. The rolling element 342 includes a rolling ring or a plurality of rolling balls. The rotation disc base 343 is firmly mounted on the first slidable tray 32 and includes a cylindrical receptacle 3431. In this embodiment, the shaft 3411 is accommodated within the cylindrical receptacle 3431 of the rotation disc base 343, and the shaft 3411 of the connection part 341 and the cylindrical receptacle 3431 of the rotation disc base 343 are cooperated with each other. The rolling element 342 is disposed between the shaft 3411 of the connection part 341 and the cylindrical receptacle 3431 of the rotation disc base 343 for allowing the shaft 3411 of the connection part 341 to be rotated relative to the cylindrical receptacle 3431 of the rotation disc base 343. Consequently, the frame 31 can be rotated relative to the first slidable tray 32 by using the first rotation shaft assembly 34. In an embodiment, the first rotation shaft assembly 34 further comprises an auxiliary connection part 344 mounted on the bottom surface of the first slidable tray 32 and coupled with the rotation disc base 343 mounted on the upper surface of the first slidable tray 32. Consequently, the rotation disc base 343 can be secured to the first slidable tray 32 firmly.

Please refer to FIG. 3 again. In this embodiment, the first slidable tray 32 includes a handle 324 disposed on a third side 323 thereof for allowing the technician to hold the handle 324 and move the first slidable tray 32 easily. The first slidable tray 32 further includes at least one fixing screw 325 mounted on the third side 323 thereof. When the first slidable tray 32 is pushed into the interior of the housing 2, the first slidable tray 32 can be secured to the housing 2 by screwing the fixing screw 325 into the fixing hole of the protrusion part 28 disposed on the inner surface of the bottom panel 24. The first slidable tray 32 further comprises a first position-limiting element 326 and a second position-limiting element 327. Preferably but not exclusively, the first position-limiting element 326 and the second position-limiting element 327 are through holes. A latching device 315 is mounted on the frame 31. Preferably, the latching device 315 is mounted on the second vertical plate 312 or the base plate 311 of the frame 31. The base plate 311 can carry the latching device 315 to move on the surface of the first slidable tray 32. When the latching device 315 disposed on the frame 31 is engaged with the first position-limiting element 326 of the first slidable tray 32, the frame 31 can't be rotated relative to the first slidable tray 32. Under this circumstance, the angle defined between the frame 31 and the first slidable tray 32 is set as zero degree, and the front panel of the equipment 4 is corresponding to the front of the equipment cabinet 1. When the latching device 315 is disengaged from the first position-limiting element 326, moves on the surface of the first slidable tray 32, and then engages with the second position-limiting element 327 of the first slidable tray 32, the frame 31 is rotated relative to the first slidable tray 32. Under this circumstance, the frame 31 is rotated relative to the first slidable tray 32 at a predetermined angle, for example but not limited to 105 degrees or 120 degrees, and the rear of the equipment 4 can be rotated toward the front of the equipment cabinet 1.

Figure 6:
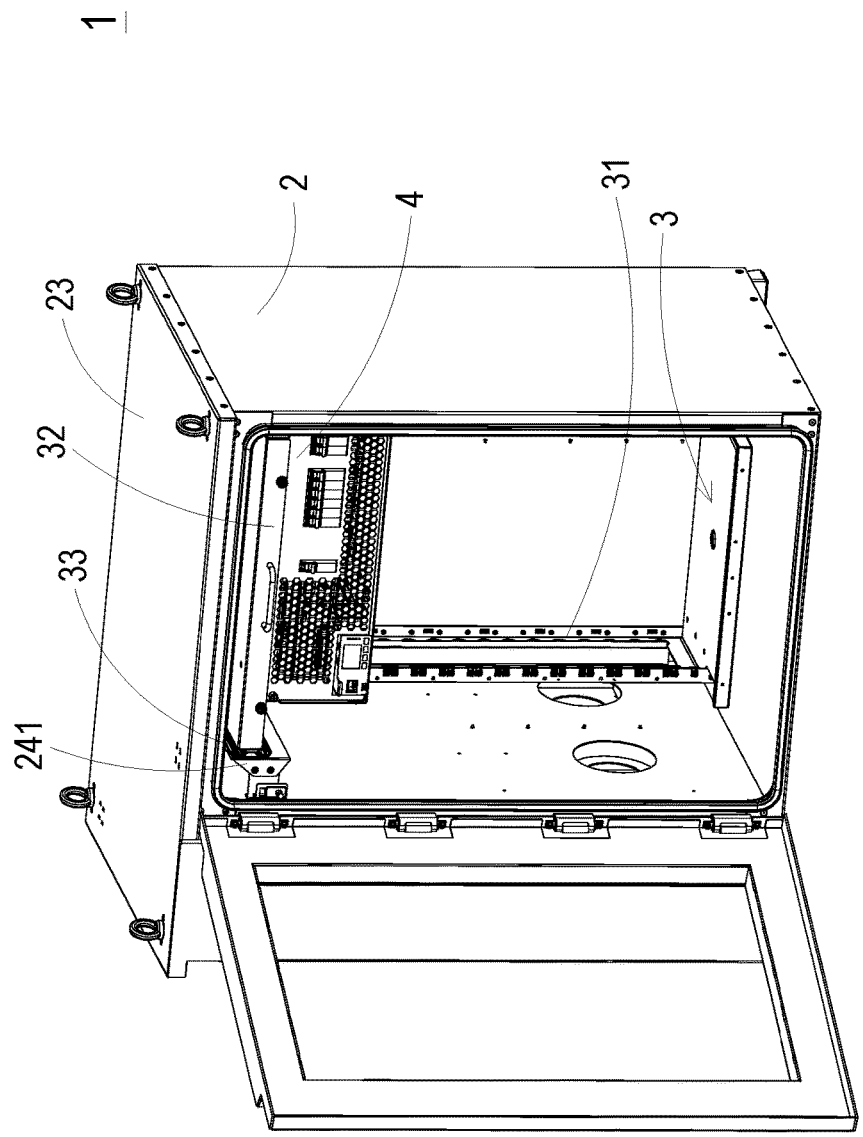
FIG. 6 is a schematic perspective view showing a variable example of the equipment cabinet of FIG. 1.

Please refer to FIGS. 1, 2 and 3 again. In this embodiment, the first slidable tray 32 and the base plate 311 of the frame 31 are disposed adjacent to the bottom panel 24 of the housing 2. FIG. 6 is a schematic perspective view showing a variable example of the equipment cabinet of FIG. 1. In another embodiment, the first slidable tray 32 and the base plate 311 of the frame 31 are disposed adjacent to the top panel 23 of the housing 2, and the first supporting bracket 241 are mounted on the inner surface of the top panel 23 of the housing 2. The first rail assemblies 33 are mounted on the inner surface of the top panel 23 of the housing 2. The first slidable tray 32 can be drawn out by using the first rail assemblies 33 mounted on the top panel 23 of the housing 2. The structures and operations of the frame 31, the first slidable tray 32, the first rail assemblies 33 and the first rotation shaft assembly as shown in FIG. 6 are the same with that of the frame 31, the first slidable tray 32, the first rail assemblies 33 and the first rotation shaft assembly 34 as shown in FIGS. 1, 2 and 3, and are not redundantly described herein.

In accordance with the concepts of the present invention, the equipment cabinet 1 includes the rack assembly 3 for installing one or more equipment 4 therein. The rack assembly 3 allows the mounted equipment 4 to be drawn out and then rotated, so that the rear of the mounted equipment 4 can be rotated toward the front of the equipment cabinet 1, and the operations of routing the cables or wires to connect with the mounted equipment 4 or disconnecting the cables or wires from the mounted equipment 4 can be performed at the front of the equipment cabinet 1. Consequently, it is labor-saving and time-saving to install and maintain the mounted equipment of the equipment cabinet 1.

Figure 7:
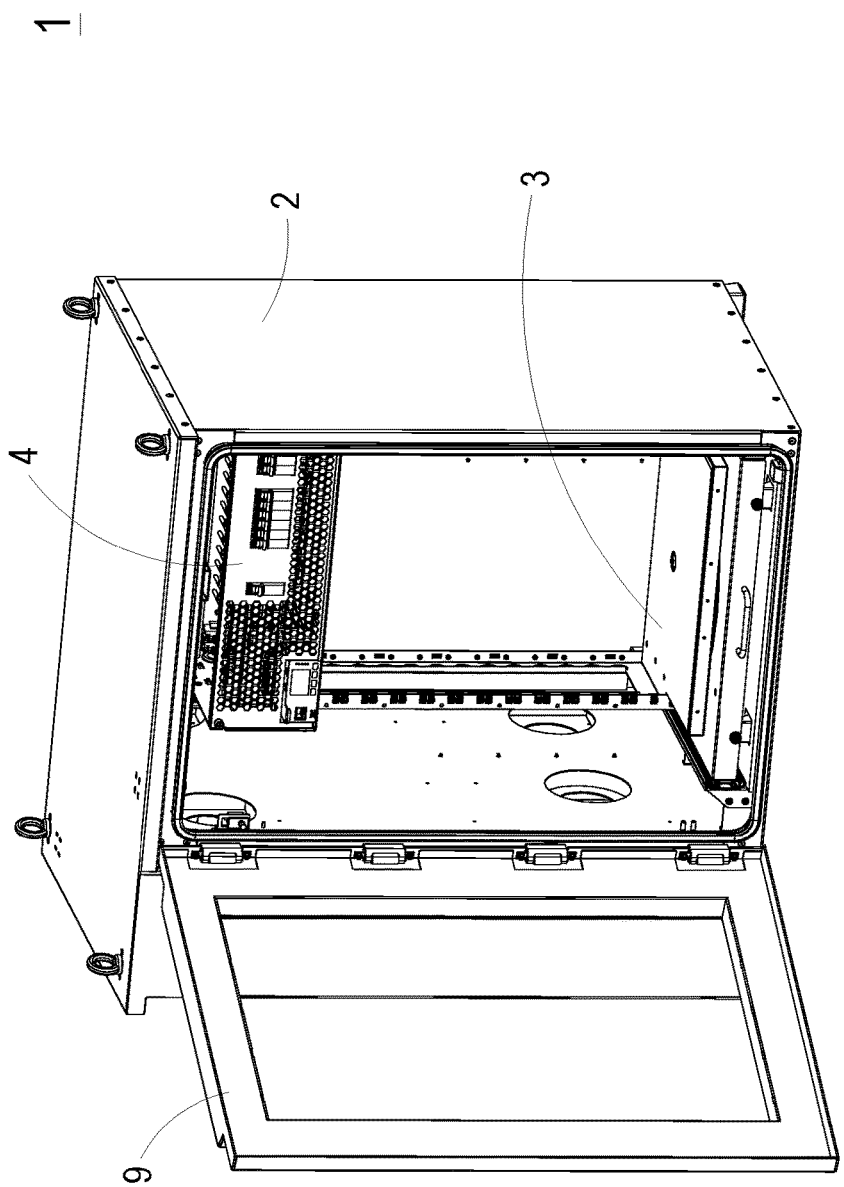
FIG. 7 is a schematic perspective view illustrating an equipment cabinet according to a second embodiment of the present invention.
Figure 8:
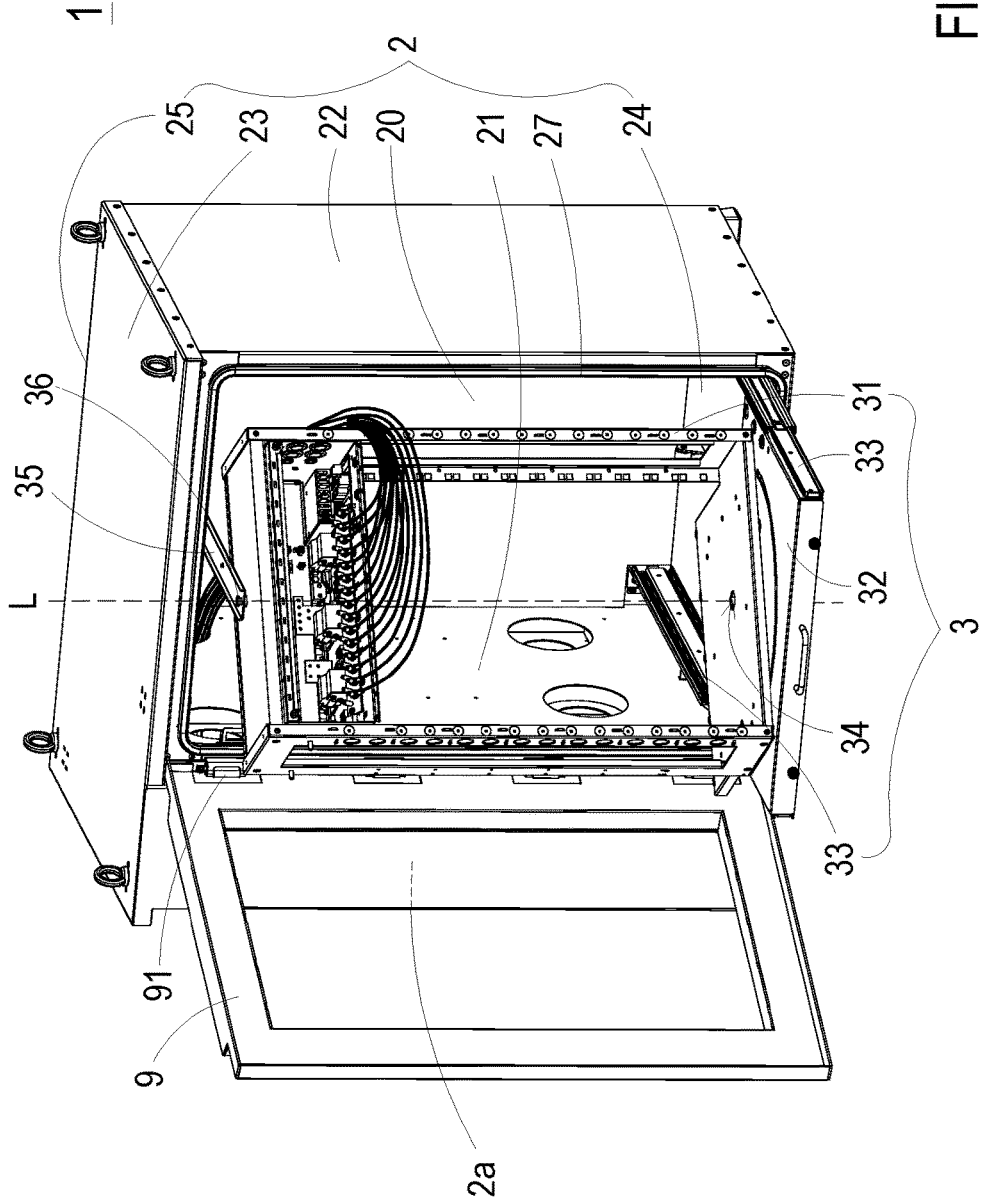
FIG. 8 is a perspective view of the equipment cabinet of FIG. 7 showing the equipment mounted in the rack assembly to be drawn out and rotated for wires routed rear access.
Figure 9:
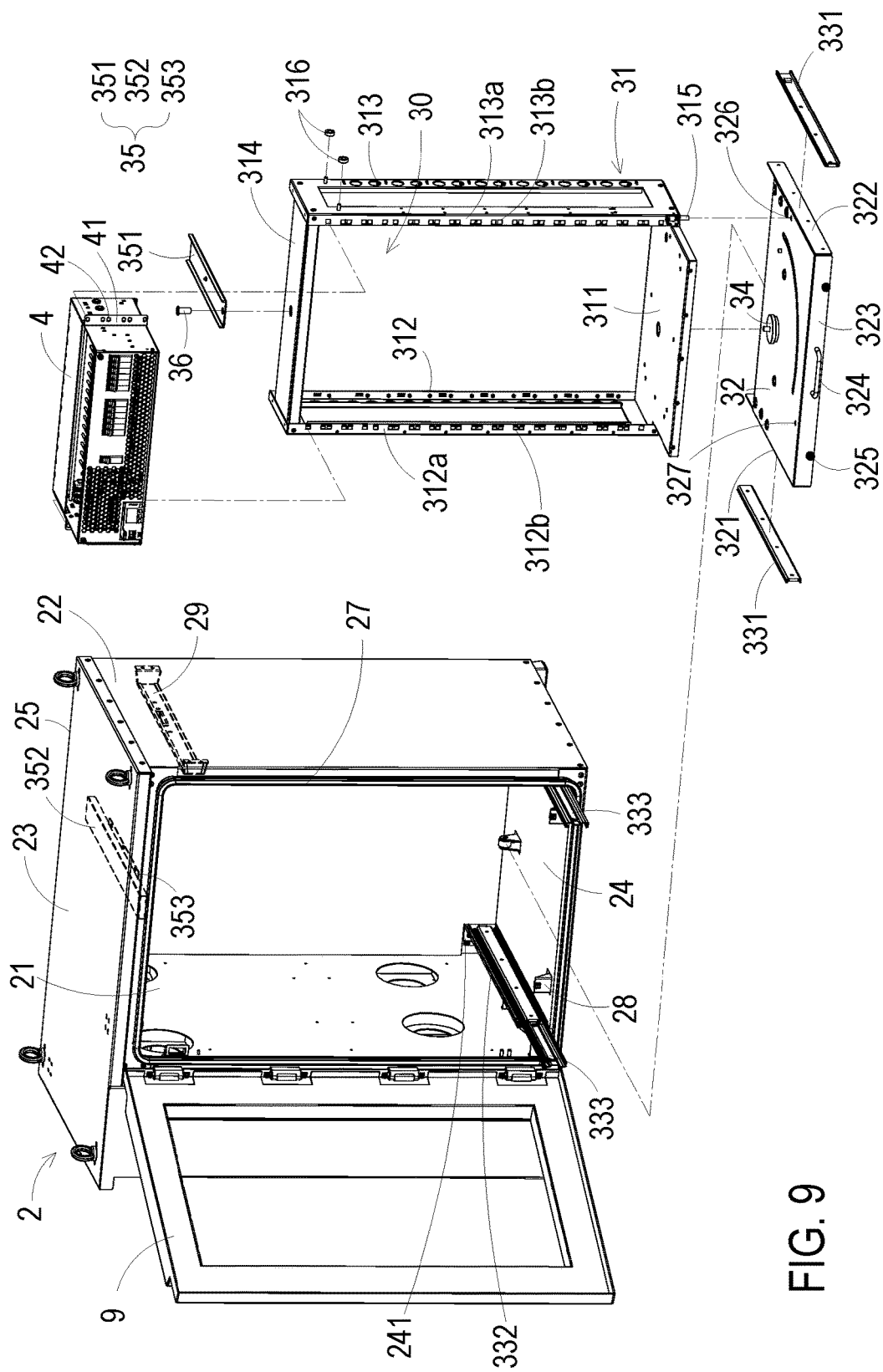
FIG. 9 is an exploded view of the rack assembly, the housing and the equipment of FIG. 8.

FIG. 7 is a schematic perspective view illustrating an equipment cabinet according to a second embodiment of the present invention, FIG. 8 is a perspective view of the equipment cabinet of FIG. 7 showing the equipment mounted in the rack assembly to be drawn out and rotated for wires routed rear access, and FIG. 9 is an exploded view of the rack assembly, the housing and the equipment of FIG. 8. As shown in FIGS. 7, 8, and 9. Similar with the first embodiment, the equipment cabinet 1 of this embodiment comprises a housing 2, a rack assembly 3 and a door 9. Component parts and elements corresponding to those of the first embodiment are designated by identical numeral references, and detailed descriptions thereof are omitted. In comparison with the first embodiment, the rack assembly 3 further comprises a second rail assembly 35 and a second rotation shaft assembly 36. The second rail assembly 35 includes an inner rail 351, an outer rail 352 and a slide coupler 353. The outer rail 352 is firmly mounted on the inner surface of the top panel 23 of the housing 2, one end of the inner rail 351 is firmly mounted on the top plate 314 of the frame 31, and the slide coupler 353 is disposed between the inner rail 351 and the outer rail 352. The structures and operations of the second rail assembly 35 are the same with that of the first rail assembly 33, and are not redundantly described herein. In an embodiment, the end of the inner rail 351 is connected with the top plate 314 of the frame 31 by the second rotation shaft assembly 36. In this embodiment, the second rotation shaft assembly 36 is a rotation shaft. The second rail assembly 35 is configured to guide and support the frame 31 at the top portion of the housing 2. When the frame 31 is drawn out of the interior of the housing 2, the frame 31 can carry the inner rail 351 to move relative to the outer rail 352 via the slide coupler 353. Consequently, the frame 31 can be moved stably. The second rotation shaft assembly 36 is coupled with the end portion of the inner rail 351 and the top plate 314 of the frame 31, and the second rotation shaft assembly 36 and the first rotation shaft assembly 34 are aligned and arranged at the same rotation axis L. Consequently, the frame 31 can be rotated around the rotation axis L defined by the first rotation shaft assembly 34 and the second rotation shaft assembly 36 after the rack assembly 3 is drawn out. Preferably but not exclusively, the first rotation shaft assembly 34 and the second rotation shaft assembly 36 are aligned with the middle of the mounted equipment 4 so as to shorten the rotation radius and gain more space for maintenance.

In an embodiment, the housing 2 further comprises a locking bracket 29 mounted on an inner surface of the second lateral panel 22, and the frame 31 further comprises at least one roller 316 disposed on the second plate 313 and corresponding to the locking bracket 29. When the frame 31 is pushed into the interior of the housing 2 via the first slidable tray 32, the roller 316 of the frame 31 is received in the groove of the locking bracket 29 and movable along the groove of the locking bracket 29. Consequently, the rack assembly 3 is limited to be rotated when the rack assembly 3 is pushed into the interior of the housing 2.

Figure 10:
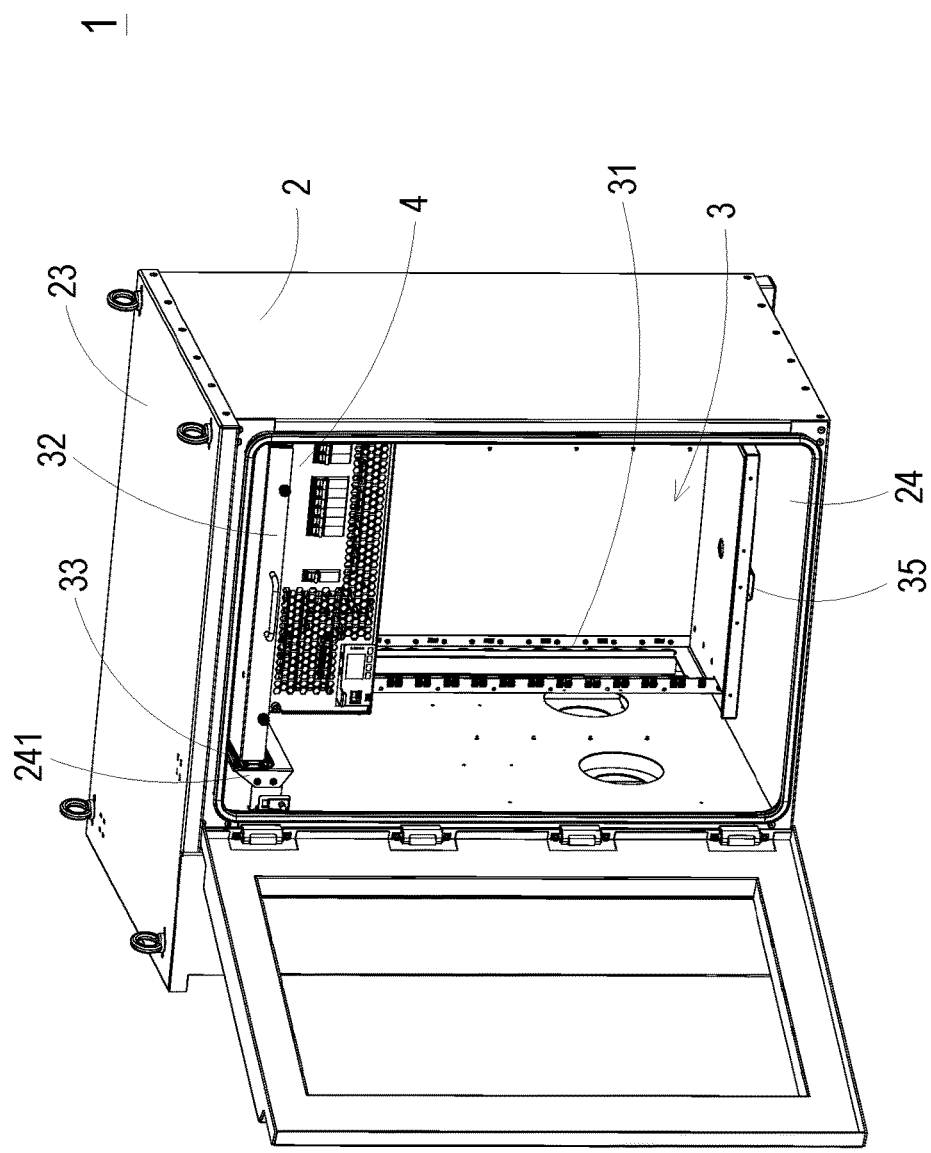
FIG. 10 is a schematic perspective view showing a variable example of the equipment cabinet of FIG. 7.

Please refer to FIGS. 7, 8 and 9 again. In this embodiment, the first slidable tray 32 and the base plate 311 of the frame 31 are disposed adjacent to the bottom panel 24 of the housing 2. FIG. 10 is a schematic perspective view showing a variable example of the equipment cabinet of FIG. 7. In another embodiment, the first slidable tray 32 and the base plate 311 of the frame 31 are disposed adjacent to the top panel 23 of the housing 2, and the first supporting bracket 241 are mounted on the inner surface of the top panel 23 of the housing 2. The first rail assemblies 33 are mounted on the inner surface of the top panel 23 of the housing 2. The second rail assembly 35 is mounted on the bottom panel 24 of the housing 2. The first slidable tray 32 can be drawn out by using the first rail assemblies 33 mounted on the top panel 23 of the housing 2, and the frame 31 can be supported and guided by the second rail assembly 35 mounted on the bottom panel 24 of the housing 2. The structures and operations of the frame 31, first slidable tray 32, the first rail assemblies 33, the first rotation shaft assembly, the second rail assembly 35 and the second rotation shaft assembly as shown in FIG. 10 are the same with that of the frame 31, the first slidable tray 32, the first rail assemblies 33, the first rotation shaft assembly 34, the second rail assembly 35 and the second rotation shaft assembly 36 as shown in FIGS. 7, 8 and 9, and are not redundantly described herein.

Figure 11:
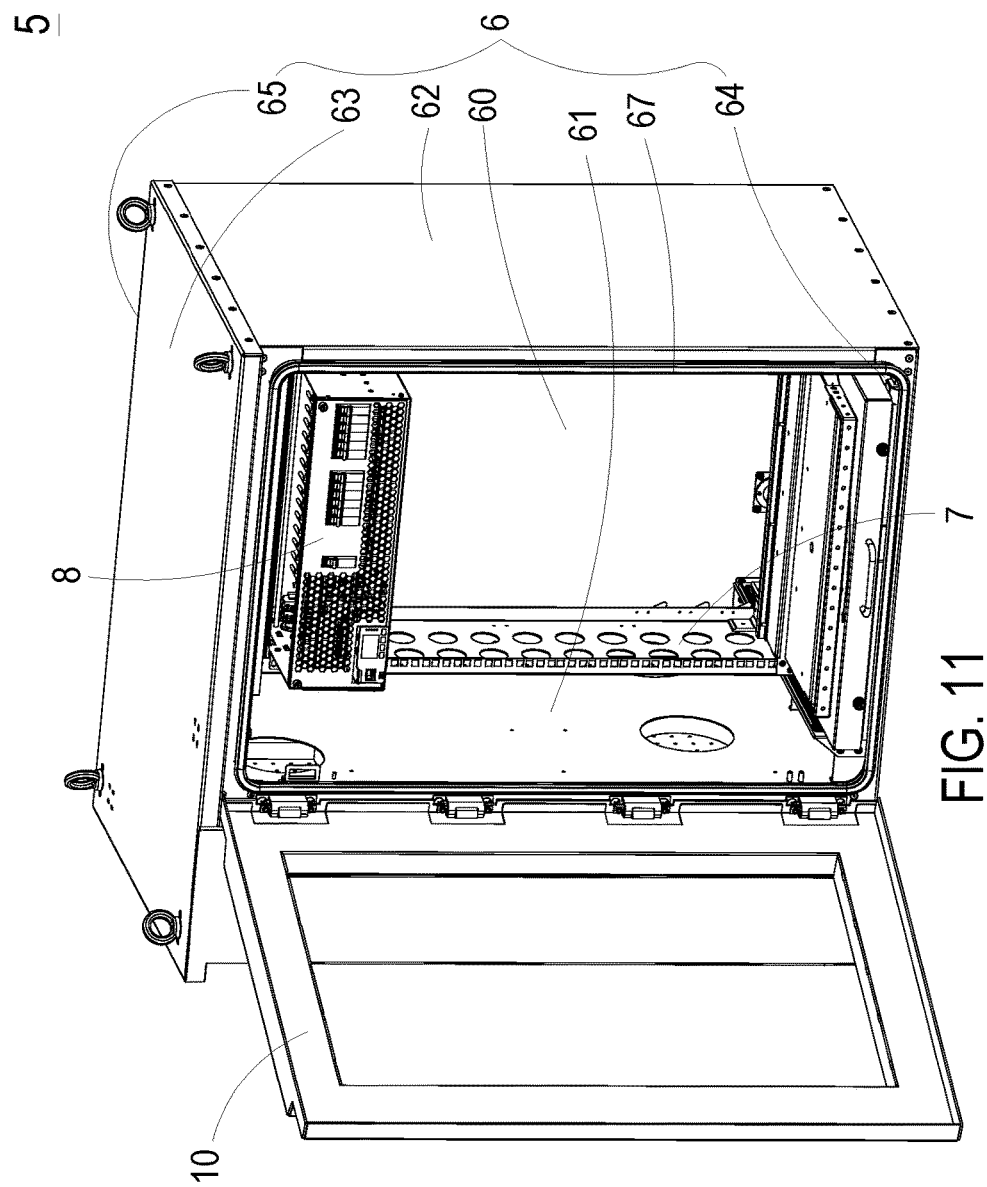
FIG. 11 is a schematic perspective view illustrating an equipment cabinet according to a third embodiment of the present invention.
Figure 12:
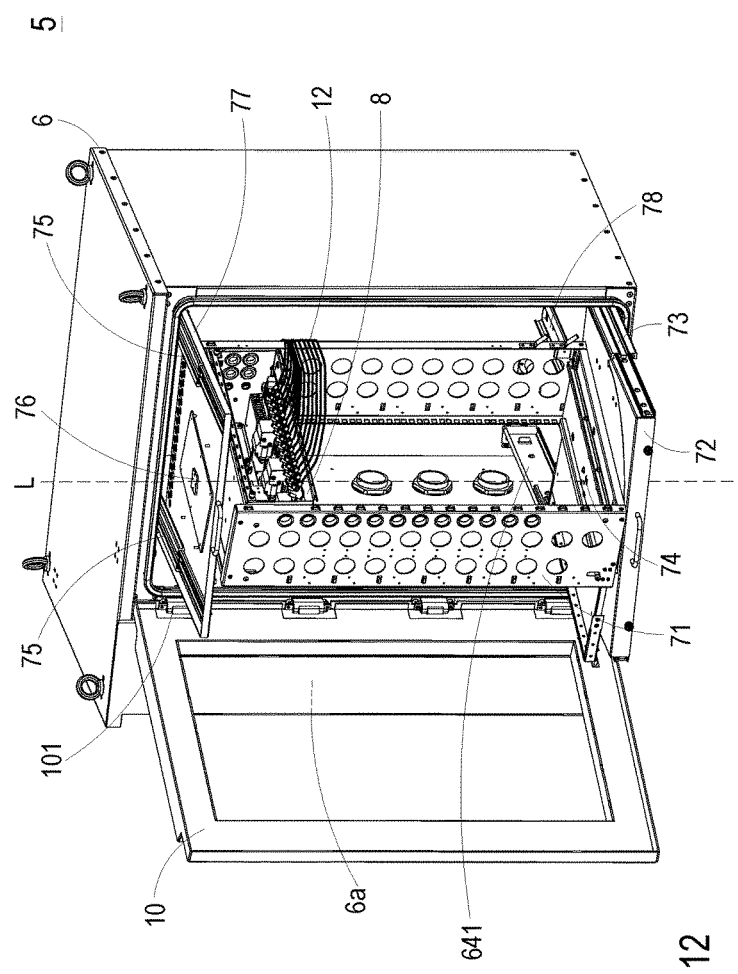
FIG. 12 is a perspective view of the equipment cabinet of FIG. 11 showing the equipment mounted in the rack assembly to be drawn out and rotated for wires routed rear access.
Figure 13:
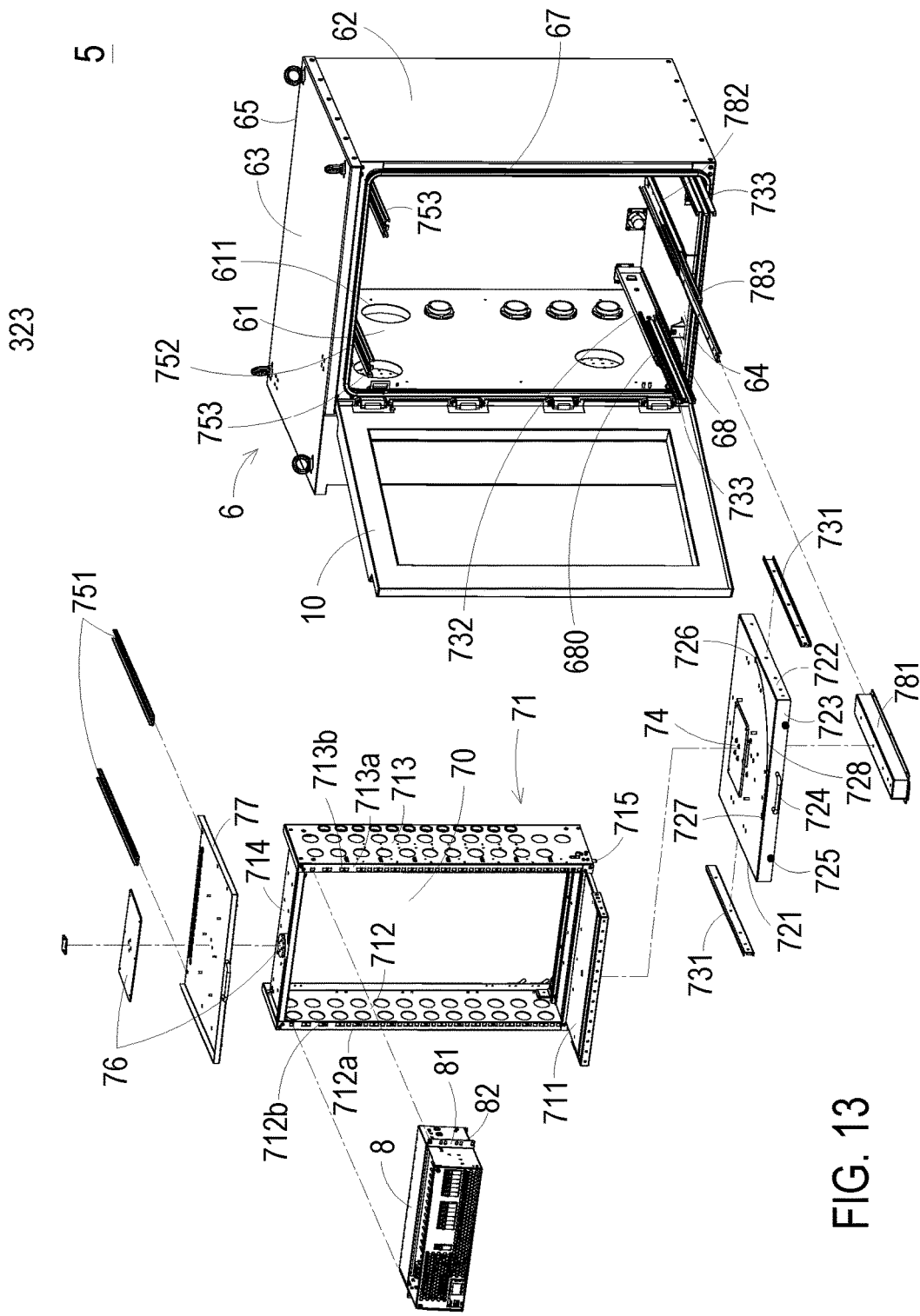
FIG. 13 is an exploded view of the rack assembly, the housing and the equipment of FIG. 12.

FIG. 11 is a schematic perspective view illustrating an equipment cabinet according to a third embodiment of the present invention, FIG. 12 is a perspective view of the equipment cabinet of FIG. 11 showing the equipment mounted in the rack assembly to be drawn out and rotated for wires routed rear access; and FIG. 13 is an exploded view of the rack assembly, the housing and the equipment of FIG. 12. As shown in FIGS. 11, 12, and 13, the equipment cabinet 5 is a telecommunication equipment cabinet. Preferably but not exclusively, the equipment cabinet 5 is a wall-mount telecommunication equipment cabinet. The equipment cabinet 5 comprises a housing 6, a slidable-and-rotatable rack assembly 7 (hereinafter referred as rack assembly), and a door 10. The housing 6 has a first lateral panel 61, a second lateral panel 62 opposite to the first lateral panel 61, a top panel 63, a bottom panel 64 opposite to the top panel 63, and a rear panel 65. The housing 6 further comprises an opening 67 and a receiving space 60 defined by the first lateral panel 61, the second lateral panel 62, the top panel 63, the bottom panel 64 and the rear panel 65. The door 10 is pivotally coupled with the housing 6 via a rotation shaft 101 and disposed at a location close to the first lateral panel 61 and opposite to the rear panel 65. The door 10 can be selectively opened or closed for covering the opening 67, so that one or more equipment 8 can be installed or accessed at the front of the equipment cabinet 5 when the door 10 is opened. In this embodiment, the housing 6 further includes an accommodation room 6a disposed close to the receiving space 60 for mounting a circuit board and receiving a plurality of cables or wires 12 therein. The accommodation room 6a and the receiving space 60 are isolated with each other by the first lateral panel 61. The first lateral panel 61 has at least one through hole 611 for allowing the cables or wires 12 to be routed from the accommodation room 6a to the receiving space 60. The rack assembly 7 is disposed in the receiving space 60 of the housing 6 and has plural compartments 70 for accommodating and installing one or more equipment 8, for example telecommunication equipment and the power supply equipment. In an embodiment, at least one power distribution unit, a plurality of power modules, and a plurality of telecommunication equipment are accommodated in the compartments 70 of the rack assembly 7 of the equipment cabinet 5. Examples of the telecommunication equipment includes but not limited to network switcher, router, or any other computing and communication device.

Please refer to FIGS. 11, 12, and 13, again. The rack assembly 7 is disposed in the interior of the housing 6 and can be drawn out and rotated for facilitating operations of routing the cables or wires 12 to connect with corresponding sockets or connection ports of the equipment 8 at the front of the equipment cabinet 5, wherein the sockets or connection ports are disposed on the rear of the equipment 8. The rack assembly 7 comprises a frame 71, a first slidable tray 72 (i.e. first movable carrier), at least two first rail assemblies 73, a first rotation shaft assembly 74 (i.e. first rotation disc assembly), at least two second rail assemblies 75, a second rotation shaft assembly 76 (i.e. second rotation disc assembly), a second slidable tray 77 (i.e. second movable carrier) and an auxiliary rail assembly 78. The frame 71 includes a base plate 711, a first vertical plate 712, a second vertical plate 713 and a top plate 714. The first ends of the first vertical plate 712 and the second vertical plate 713 are connected with two sides of the top plate 714, respectively, and the second ends of the first vertical plate 712 and the second vertical plate 713 are connected with two sides of the base plate 711, respectively. The first vertical plate 712 and the second vertical plate 713 are spaced apart and parallel with each other. Plural compartments 70 are formed in space defined by the base plate 711, the first vertical plate 712, the second vertical plate 713 and the top plate 714 for accommodating and installing one or more equipment 8. In an embodiment, each of the first vertical plate 712 and the second vertical plate 713 has a mounting surface 712a, 713a, wherein the mounting surface 712a, 713a has a plurality of fixing holes 712b, 713b arranged thereon. The fixing holes 712b are spaced apart with a specific distance, and the fixing holes 713b are spaced apart with a specific distance. When the equipment 8 are installed into the compartments 70 of the rack assembly 7, the brackets 81 of the equipment 8 can be secured to the mounting surfaces 712a, 713a of the first vertical plate 712 and the second vertical plate 713 by using screws (not shown) to screwing into the fixing holes 82 on the brackets 81 and the corresponding fixing holes 712b, 713b on the first vertical plate 712 and the second vertical plate 713. Consequently, the equipment 8 can be securely fixed to frame 71 of the rack assembly 7.

Figure 14A:
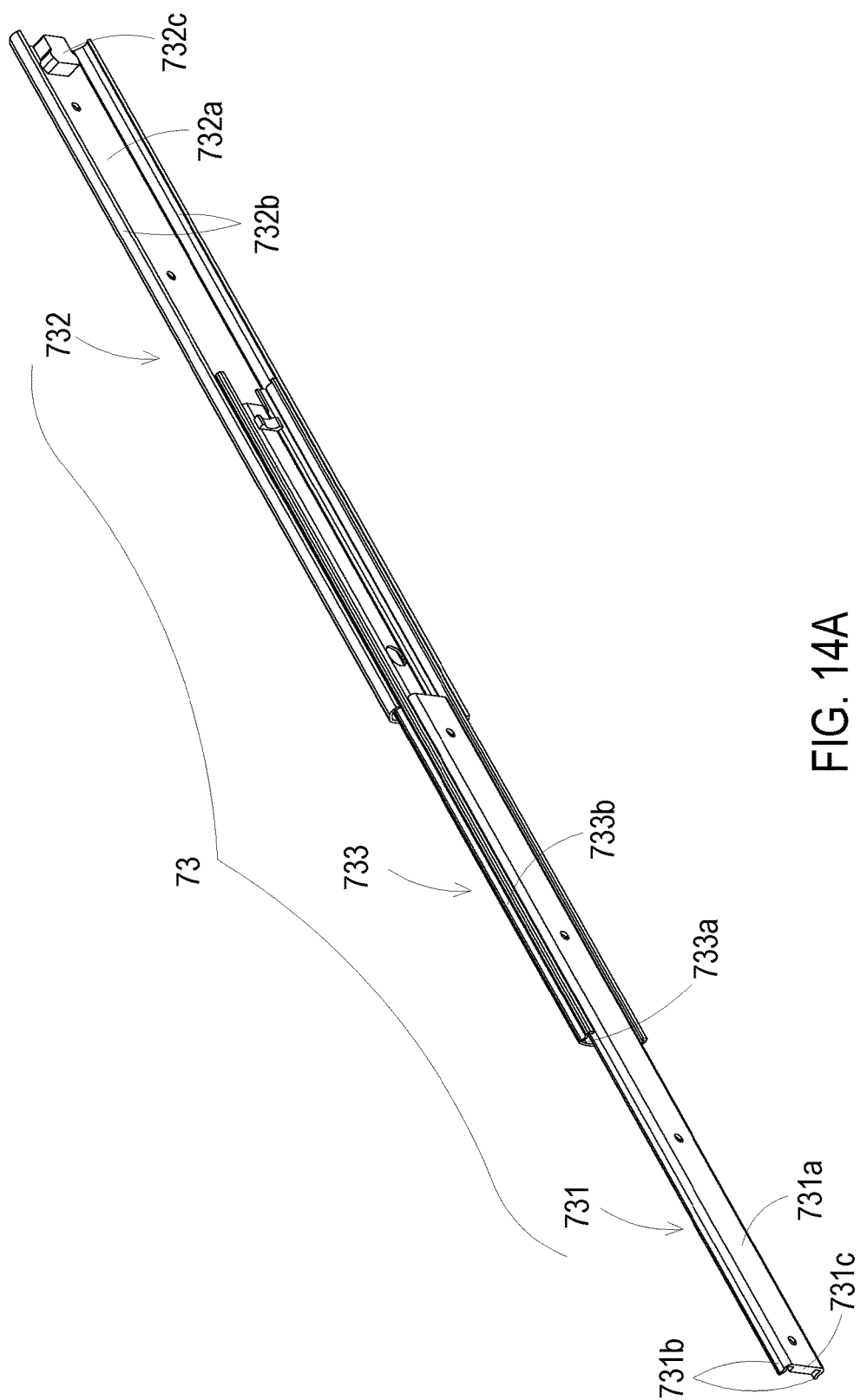
FIG. 14A is a schematic perspective view of the first rail assembly of FIG. 13.
Figure 14B:
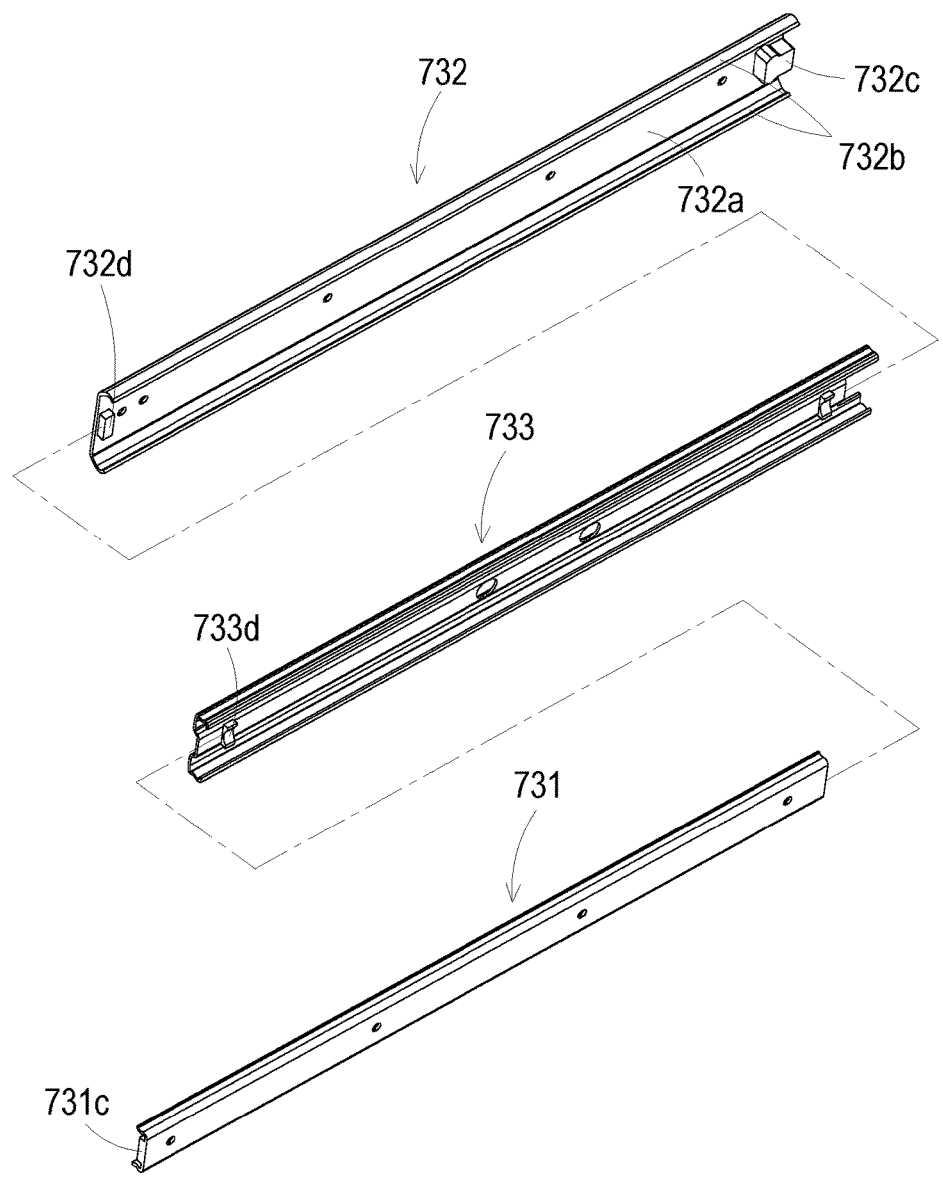
FIGS. 14B and 14C are exploded views showing the inner rail, the outer rail and the slide coupler of FIG. 14A.
Figure 14C:
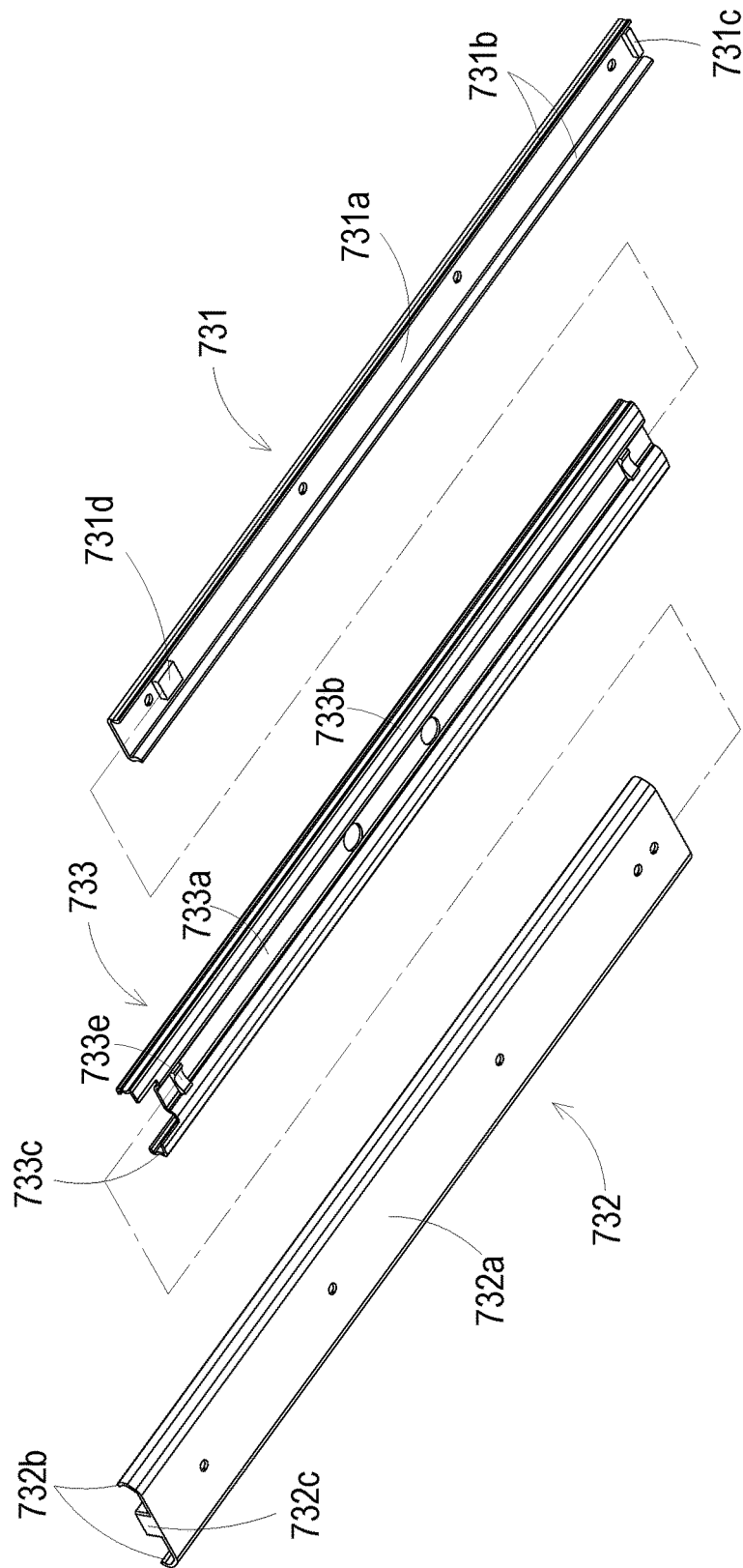
Figure 14D:
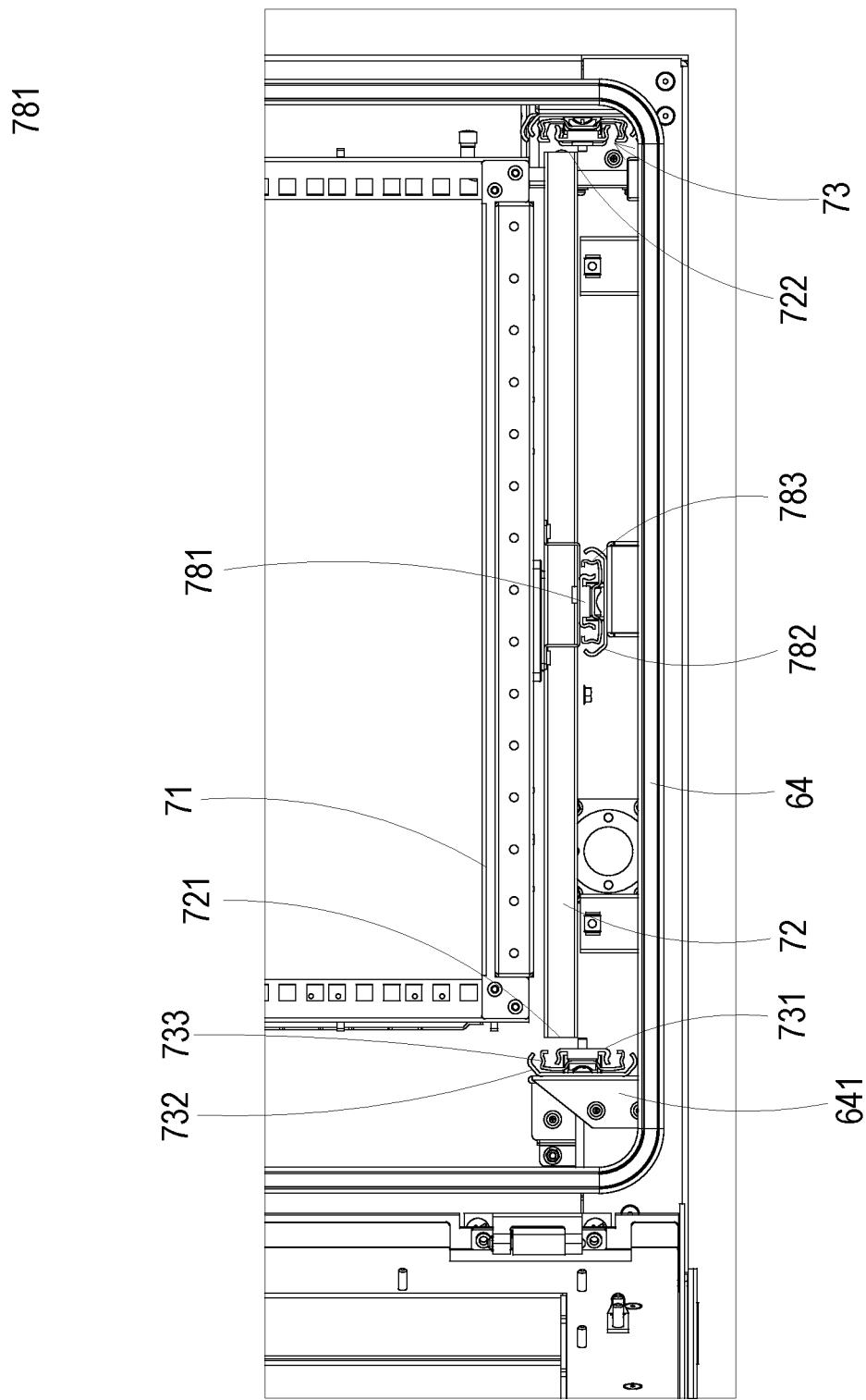
FIG. 14D is a schematic perspective view showing two first rail assemblies, the auxiliary rail assembly, the first slidable tray and the first supporting bracket of FIG. 13.

FIG. 14A is a schematic perspective view of the first rail assembly of FIG. 13, FIGS. 14B and 14C are exploded views showing the inner rail, the outer rail and the slide coupler of FIG. 14A, and FIG. 14D is a schematic perspective view showing two first rail assemblies, the auxiliary rail assembly, the first slidable tray and the first supporting bracket of FIG. 13. As shown in FIGS. 13, 14A, 14B, 14C, and 14D, all of the first rail assemblies 73, the second rail assemblies 75 and the auxiliary rail assembly 78 are telescopic rail assemblies. Preferably, each of the first rail assembly 73, the second rail assembly 75 and the auxiliary rail assembly 78 is a steel telescopic rail assembly. In this embodiment, the structures and operations of the first rail assembly 73, the second rail assembly 75 and the auxiliary rail assembly 78 are the same.

The first rail assembly 73 includes an inner rail 731, an outer rail 732 and a slide coupler 733. The inner rails 731 of the two first rail assemblies 73 are firmly mounted on a first side 721 and a second side 722 of the first slidable tray 72, respectively, wherein the second side 722 is opposite to the first side 721. Namely, the inner rails 731 are stationary rails relative to the first slidable tray 72. The housing 6 further comprises at least two first supporting brackets 641 disposed on the inner surface of the bottom panel 64 of the housing 6. The two first supporting brackets 641 are evenly spaced apart and parallel with each other. The outer rails 732 of the two first rail assemblies 73 are firmly mounted on the two first supporting brackets 641, respectively. Namely, the outer rails 732 are stationary rails with respect to the bottom panel 64 of the housing 6. Alternatively, the outer rails 732 of the two first rail assemblies 73 are firmly and directly mounted on the first lateral panel 61 and the second lateral panel 62 of the housing 6, respectively. Alternatively, one of the outer rails 732 is firmly and directly mounted on the first lateral panel 61 of the housing 6, and the other of the outer rails 732 is firmly mounted on the first supporting bracket 641. Alternatively, one of the outer rails 732 is firmly and directly mounted on the second lateral panel 62 of the housing 6, and the other of the outer rails 732 is firmly mounted on the first supporting bracket 641.

The slide coupler 733 is connected with the outer rail 732 and the inner rail 731, disposed between the outer rail 732 and the inner rail 731 and slidable relative to the outer rail 732 and the inner rail 731. Namely, the slide coupler 733 is inserted into the accommodation space of the outer rail 732, and the slide coupler 73 is slidable within the accommodation space of the outer rail 732 in a longitudinal direction. The inner rail 731 is inserted into the accommodation space of the slide coupler 733, and the inner rail 731 is slidable within the accommodation space of the slide coupler 733 in a longitudinal direction. The inner rail 731 has a first transverse plate 731a, two lateral flanges 731b, a first stopper 731c and a second stopper 731d. The two lateral flanges 731b are disposed at two opposite transverse side edges of the first transverse plate 731a, and the first stopper 731c and the second stopper 731d are disposed at two opposite ends of the first transverse plate 731a. Preferably, the inner rail 731 has an essentially U-shaped cross-section. The outer rail 732 has a second transverse plate 732a, two lateral arms 732b, a third stopper 732c and a fourth stopper 732d. The two lateral arms 732b are disposed at two opposite transverse side edges of the second transverse plate 732a, and the third stopper 732c and the fourth stopper 732d are disposed at two opposite ends of the second transverse plate 732a. Preferably, the outer rail 732 has an essentially C-shaped cross-section. The slide coupler 733 has a third transverse plate 733a, two curved protrusion parts 733b, two slots 733c, a fifth stopper 733d and a sixth stopper 733e. The two curved protrusion parts 733b are disposed at two opposite transverse side edges of the third transverse plate 733a, the two slots 733c are disposed at the accommodation space of the slide coupler 733 and corresponding to the two curved protrusion parts 733b, respectively. The fifth stopper 733d and the sixth stopper 733e are disposed at two opposite ends of the third transverse plate 732a. When the inner rail 731, the outer rail 732 and the slide coupler 733 are assembled together, the inner rail 731 is inserted into the slide coupler 733, and the two flanges 731b of the inner rail 731 are received within the two slot 733c of the slide coupler 733. In addition, the slide coupler 733 is inserted into the outer rail 732, and the two curved protrusion parts 733b of the slide coupler 733 are corresponding to the two arms 732b of the outer rail 732. The fifth stopper 733d of the slide coupler 733 is disposed between the first stopper 731c and the second stopper 731d of the inner rail 731, so that the movement between the inner rail 731 and the slide coupler 733 can be limited. The sixth stopper 733e of the slide coupler 733 is disposed between the third stopper 732c and the fourth stopper 732d of the outer rail 732, so that the movement between the outer rail 732 and the slide coupler 733 can be limited. Consequently, the first slidable tray 72 can slide out from the interior of the housing 6 and carry the frame 71 to move correspondingly by using the first rail assemblies 73. In this embodiment, the two rail assemblies 73 are configured to guide and support the first slidable tray 72 at two opposite sides, so that the operations of drawing the frame 71 out of the interior of the housing 6 can be performed more stably, and the shift or displacement of the frame 71 can be prevented.

The second rail assembly 75 comprises an inner rail 751, an outer rail 752 and a slide coupler 753. The inner rail 751 is firmly mounted on the second slide tray 77, and the outer rail 752 is firmly mounted on the top panel 63 of the housing 6. The slide coupler 753 is disposed between the inner rail 751 and the outer rail 752. The structures and the operations of the inner rail 751, the outer rail 752 and the slide coupler 753 of the second rail assembly 75 are the same with that of the inner rail 731, the outer rail 732 and the slide coupler 733 of the first rail assembly 73, and are not redundantly described herein. The second rail assemblies 75 are configured to guide the frame 71 to be moved at the top portion of the housing 6 more stably.

The auxiliary rail assembly 78 comprises an inner rail 781, an outer rail 782 and a slide coupler 783. The inner rail 781 is firmly mounted on the bottom surface of the first slide tray 72, and the outer rail 782 is firmly mounted on the bottom panel 64 of the housing 6. The slide coupler 783 is disposed between the inner rail 781 and the outer rail 782. The structures and the operations of the inner rail 781, the outer rail 782 and the slide coupler 783 of the auxiliary rail assembly 78 are the same with that of the inner rail 731, the outer rail 732 and the slide coupler 733 of the first rail assembly 73, and are not redundantly described herein. The auxiliary rail assemblies 78 are configured to guide the frame 71 to be moved at the bottom portion of the housing 6 more stably.

Figure 15A:
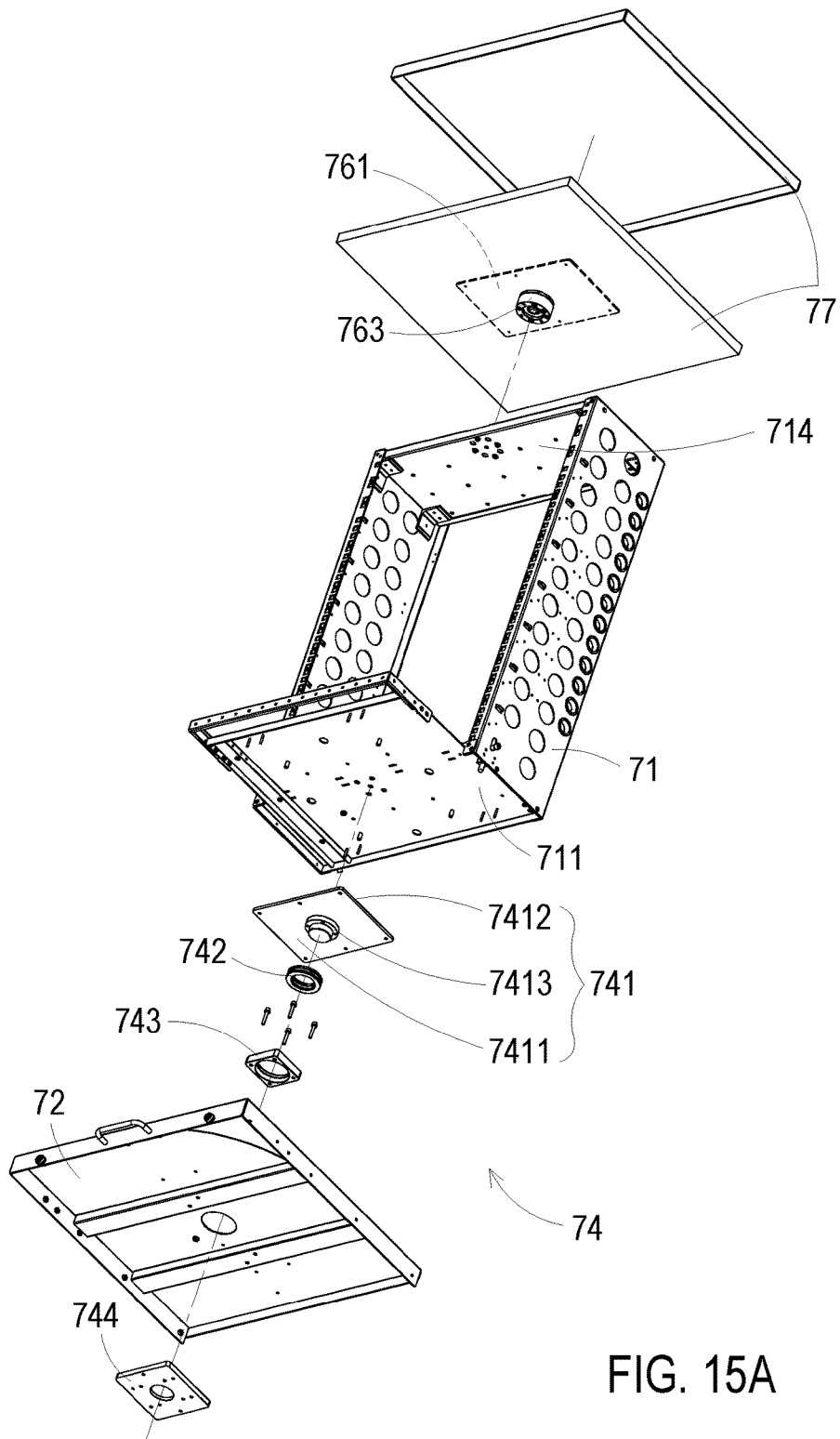
FIG. 15A is an exploded view of the first rotation shaft assembly, the frame and the second rotation assembly of FIG. 13.
Figure 15C:
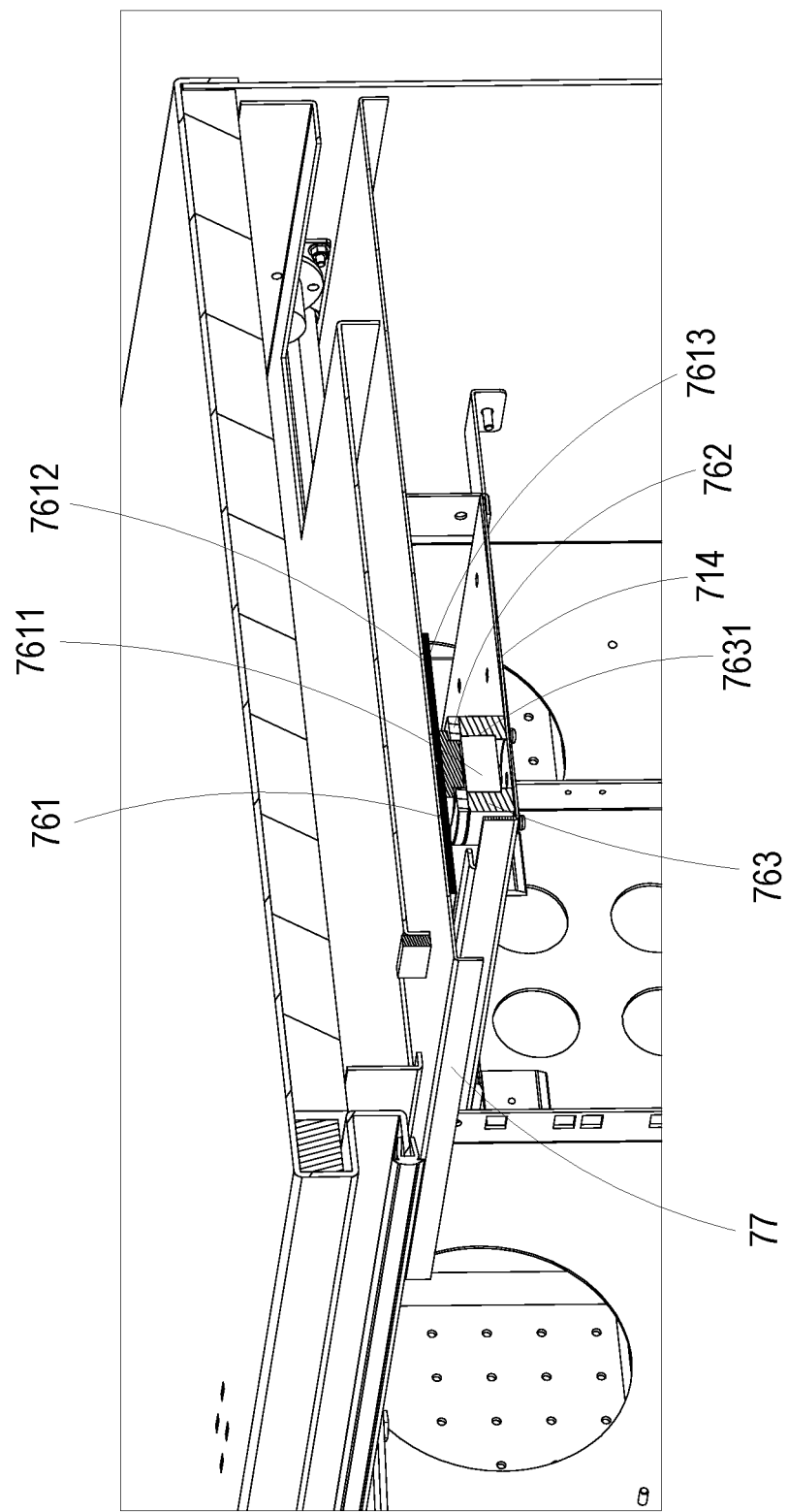
FIG. 15C is a partially cross-sectional view showing the second rotation shaft assembly, the frame and the second slidable tray of FIG. 13.

FIG. 15A is an exploded view of the first rotation shaft assembly, the frame and the second rotation assembly of FIG. 13, FIG. 15B is a partially cross-sectional view showing the first rotation shaft assembly, the frame and the first slidable tray of FIG. 13, and FIG. 15C is a partially cross-sectional view showing the second rotation shaft assembly, the frame and the second slidable tray of FIG. 13. As shown in FIGS. 13, 15A, and 15B the first rotation shaft assembly 74 is coupled with the base plate 711 of the frame 71 and the first slidable tray 72 on the middle of the base plate 711 and the first slidable tray 72, so that the frame 71 can be rotated relative to the first slidable tray 72 by using the first rotation shaft assembly 74. Preferably but not exclusively, the first rotation shaft assembly 74 is aligned with the middle of the mounted equipment 8 so as to shorten the rotation radius and gain more space for maintenance. The first rotation shaft assembly 74 includes a connection part 741, a rolling element 742, and a rotation disc base 743. The connection part 741 has a shaft 7411, a first surface 7412 and a second surface 7413. The connection part 741 is firmly mounted on the base plate 711 of the frame 71, wherein the first surface 7412 of the connection part 741 is face to the base plate 711 of the frame 71. The shaft 7411 is disposed on the second surface 7413 of the connection part 741. The rolling element 742 includes a rolling ring or a plurality of rolling balls. The rotation disc base 743 is firmly mounted on the first slidable tray 72 and includes a cylindrical receptacle 7431. In this embodiment, the shaft 7411 is accommodated within the cylindrical receptacle 7431 of the rotation disc base 743, and the shaft 7411 of the connection part 741 and the cylindrical receptacle 7431 of the rotation disc base 743 are cooperated with each other. The rolling element 742 is disposed between the shaft 7411 of the connection part 741 and the cylindrical receptacle 7431 of the rotation disc base 743 for allowing the shaft 7411 of the connection part 741 to be rotated relative to the cylindrical receptacle 7431 of the rotation disc base 743. Consequently, the frame 71 can be rotated relative to the first slidable tray 72 by using the first rotation shaft assembly 74. In an embodiment, the first rotation shaft assembly 74 further comprises an auxiliary connection part 744 mounted on the bottom surface of the first slidable tray 72 and coupled with the rotation disc base 743 mounted on the upper surface of the first slidable tray 72. Consequently, the rotation disc base 743 can be secured to the first slidable tray 72 firmly.

As shown in FIGS. 13, 15A, and 15C, the second rotation shaft assembly 76 is coupled with the top plate 714 of the frame 71 and the second slidable tray 77 on the middle of the top plate 714 and the second slidable tray 77, so that the frame 71 can be rotated relative to the second slidable tray 77 by using the second rotation shaft assembly 76. Preferably but not exclusively, the second rotation shaft assembly 76 is aligned with the middle of the mounted equipment 8 so as to shorten the rotation radius and gain more space for maintenance. The second rotation shaft assembly 76 includes a connection part 761, a rolling element 762, and a rotation disc base 763. The connection part 761 has a shaft 7611, a first surface 7612 and a second surface 7613. The connection part 761 is firmly mounted on the second slidable tray 77, wherein the first surface 7612 of the connection part 761 is face to the second slidable tray 77. The shaft 7611 is disposed on the second surface 7613 of the connection part 761. The rolling element 762 includes a rolling ring or a plurality of rolling balls. The rotation disc base 763 is firmly mounted on the top plate 714 of the frame 71 and includes a cylindrical receptacle 7631. In this embodiment, the shaft 7611 is accommodated within the cylindrical receptacle 7631 of the rotation disc base 763, and the shaft 7611 of the connection part 761 and the cylindrical receptacle 7631 of the rotation disc base 763 are cooperated with each other. The rolling element 762 is disposed between the shaft 7611 of the connection part 761 and the cylindrical receptacle 7631 of the rotation disc base 763 for allowing the shaft 7611 of the connection part 761 to be rotated relative to the cylindrical receptacle 7631 of the rotation disc base 763. Consequently, the frame 71 can be rotated relative to the second slidable tray 77 by using the second rotation shaft assembly 36.

Please refer to FIG. 13 again. In an embodiment, the first slidable tray 72 includes a handle 724 disposed on a third side 723 thereof for allowing the technician to hold the handle 724 and move the first slidable tray 72 easily. The first slidable tray 72 further includes at least one fixing screw 725 mounted on the third side 723 thereof. When the first slidable tray 72 is pushed into the interior of the housing 6, the first slidable tray 72 can be secured to the housing 6 by screwing the fixing screw 725 into the fixing hole 680 of the protrusion part 68 disposed on the inner surface of the bottom panel 64.

Figure 16B:
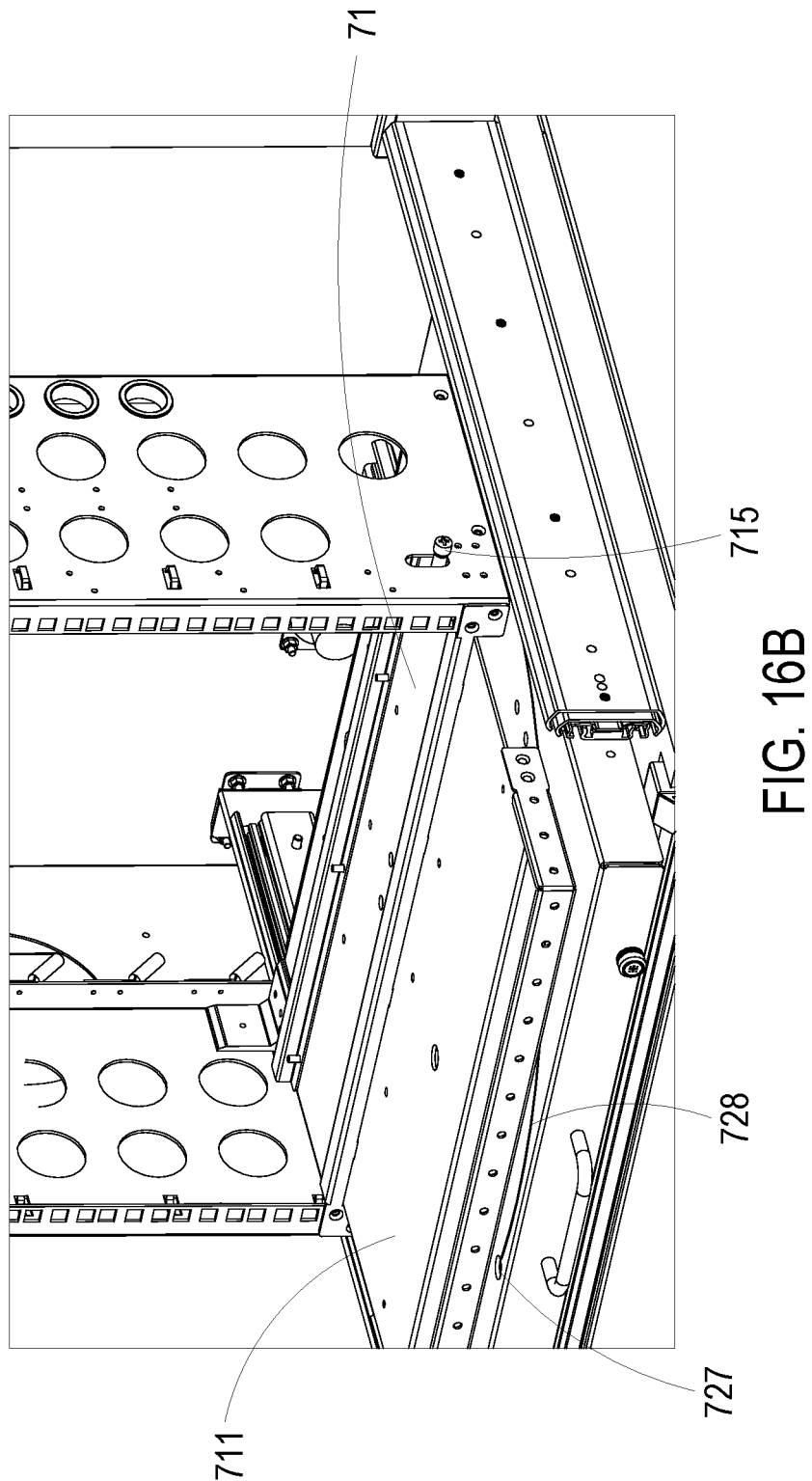

FIGS. 16A and 16B are partially cross-sectional views showing the auto-latch mechanism of FIG. 13. As shown in FIGS. 13, 16A and 16B, the first slidable tray 72 further comprises a first position-limiting element 726 and a second position-limiting element 727. Preferably but not exclusively, the first position-limiting element 726 and the second position-limiting element 727 are through holes. A latching device 715 is mounted on the frame 71. Preferably, the latching device 715 is mounted on the base plate 711 or the second vertical plate 713 of the frame 71. The base plate 711 can carry the latching device 715 to move on the surface of the first slidable tray 72. When the latching device 715 of the base plate 711 of the frame 71 is engaged with the first position-limiting element 726 of the first slidable tray 72, the frame 71 can't be rotated relative to the first slidable tray 72. Under this circumstance, the angle defined between the frame 71 and the first slidable tray 72 is set as zero degree, and the front panel of the equipment 8 is corresponding to the front of the equipment cabinet 5. When the latching device 715 is disengaged from the first position-limiting element 726, moves on the surface of the first slidable tray 72, and then engages with the second position-limiting element 727 of the first slidable tray 72, the frame 71 is rotated relative to the first slidable tray 72. Under this circumstance, the frame 71 is rotated relative to the first slidable tray 72 at a predetermined angle, for example but not limited to 105 degrees or 120 degrees, and the rear of the equipment 8 can be rotated toward the front of the equipment cabinet 5. In an embodiment, the first slidable tray 72 further comprises a guiding slot 728 connected with the first position-limiting element 726 and the second position-limiting element 727 for guiding the end portion of the latching device 715 to move between the first position-limiting element 726 and the second position-limiting element 727. Preferably, the guiding slot 728 is a curved guiding slot 728.

In an embodiment, one of the second slidable tray 77 and the second rotation shaft assembly 76 can optionally include a rotation limitation device (not shown) for limiting the rotation direction of the frame 71.

Figure 17:
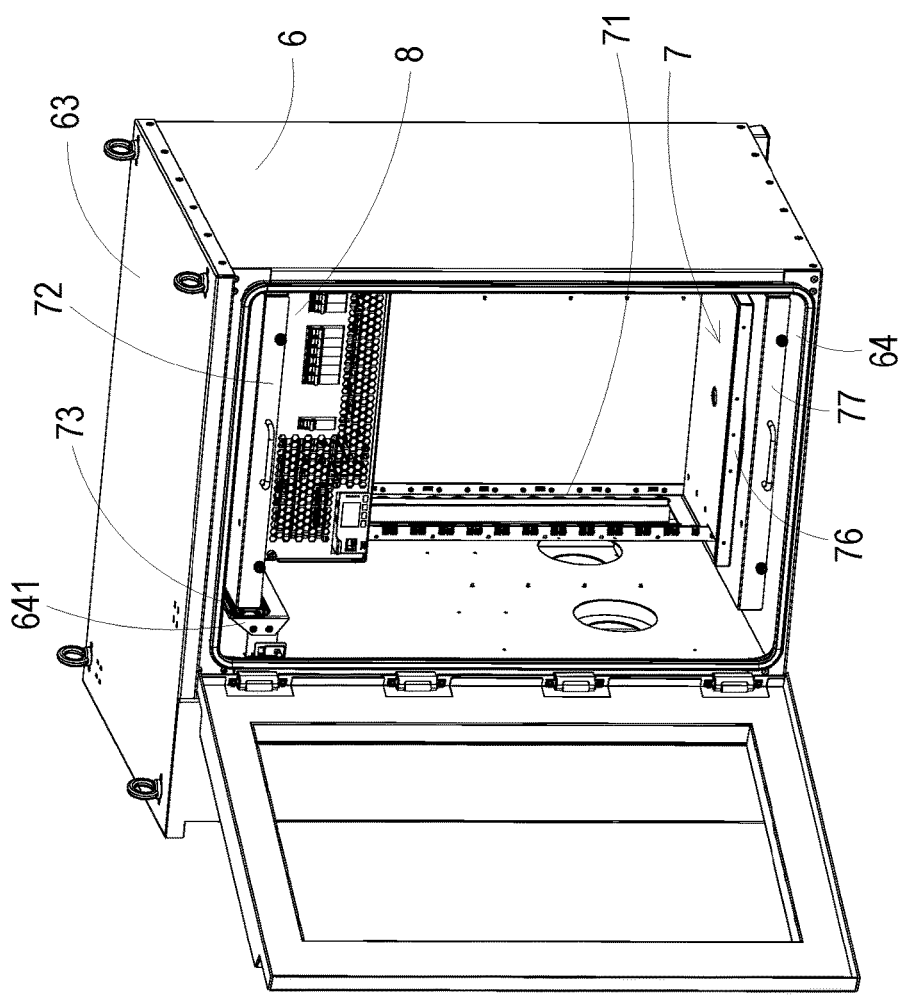
FIG. 17 is a schematic perspective view showing a variable example of the equipment cabinet of FIG. 11.

Please refer to FIGS. 11, 12 and 13 again. In this embodiment, the first slidable tray 72 and the base plate 711 of the frame 71 are disposed adjacent to the bottom panel 64 of the housing 6. FIG. 17 is a schematic perspective view showing a variable example of the equipment cabinet of FIG. 11. In another embodiment, the first slidable tray 72 and the base plate 711 of the frame 71 are disposed adjacent to the top panel 63 of the housing 6, and the first supporting bracket 641 are mounted on the inner surface of the top panel 63 of the housing 6. The first rail assemblies 73 are mounted on the inner surface of the top panel 63 of the housing 6. The second rail assembly 75 is mounted on the bottom panel 64 of the housing 6. The second slidable tray 77 and the second rotation shaft assembly 76 are close to the bottom panel 64 of the housing 6. The first slidable tray 72 can be drawn out by using the first rail assemblies 73 mounted on the top panel 63 of the housing 6, the second slidable tray 77 can be drawn out by using the second rail assemblies 75 mounted on the bottom panel 64 of the housing 6, and the frame 71 can be supported and guided by the first rail assemblies 73 and the second rail assemblies 75. The structures and operations of the frame 71, first slidable tray 72, the first rail assemblies 73, the first rotation shaft assembly 74, the second rail assembly 75, the second rotation shaft assembly 76 and the second slidable tray 77 as shown in FIG. 17 are the same with that of the frame 71, first slidable tray 72, the first rail assemblies 73, the first rotation shaft assembly 74, the second rail assembly 75, the second rotation shaft assembly 76 and the second slidable tray 77 as shown in FIGS. 11, 12 and 13, and are not redundantly described herein.

From the above descriptions, the present invention provides an equipment cabinet including a rack assembly for installing one or more equipment therein. The rack assembly allows the mounted equipment to be drawn out and then rotated, so that the rear of the mounted equipment can be rotated toward the front of the equipment cabinet, and the operations of routing the cables or wires to connect with the mounted equipment or disconnecting the cables or wires from the mounted equipment can be performed at the front of the equipment cabinet. Consequently, it is labor-saving and time-saving to install and maintain the mounted equipment of the equipment cabinet.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An equipment cabinet, comprising:
    a housing having a receiving space;
    a rack assembly disposed in the receiving space of the housing and comprising:
        a first slidable tray;
        at least two first rail assemblies, connected with the first slidable tray and the housing respectively and configured for allowing the first slidable tray to be moved relative to the housing;
        a frame carried by the first slidable tray and having a base plate, wherein the frame has a plurality of compartments for accommodating and installing one or more equipment; and
        a first rotation shaft assembly coupled with the base plate of the frame and the first slidable tray and configured for allowing the frame to be rotated relative to the first slidable tray after the frame carried by the first slidable tray is drawn out,
    wherein the first slidable tray further comprises a first position-limiting element and a second position-limiting element, and the frame further comprises a latching device, wherein when the latching device is engaged with the first position-limiting element, the frame is limited to be rotated relative to the first slidable tray, and when the latching device is moved and engaged with the second position-limiting element, the frame is rotated relative to the first slidable tray at a specific angle.

2. The equipment cabinet according to claim 1, wherein the equipment cabinet is a telecommunication equipment cabinet.

3. The equipment cabinet according to claim 1, wherein the housing has a first lateral panel, a second lateral panel opposite to the first lateral panel, a top panel, a bottom panel opposite to the top panel, a rear panel, and an opening.

4. The equipment cabinet according to claim 3, wherein the housing further includes an accommodation room disposed close to the receiving space, the accommodation room and the receiving space are isolated with each other by the first lateral panel, and the first lateral panel has at least one through hole.

5. The equipment cabinet according to claim 3, wherein each of the first rail assemblies is a telescopic rail assembly and comprises an inner rail, an outer rail and a slide coupler, wherein the inner rails of the first rail assemblies are mounted on a first side and a second side of the first slidable tray respectively, the outer rails are mounted on two first supporting brackets of the housing respectively or mounted on the first lateral panel and the second lateral panel respectively, and the slide coupler is disposed between the inner rail and the outer rail and slidable relative to the inner rail and the outer rail.

6. The equipment cabinet according to claim 3, wherein the frame further includes a first vertical plate, a second vertical plate and a top plate, the first vertical plate is connected with the base plate and the top plate, the second vertical plate is connected with the base plate and the top plate, and the first vertical plate and the second vertical plate are spaced apart and parallel with each other.

7. The equipment cabinet according to claim 6, wherein the rack assembly further comprises:
    a second rail assembly comprising an inner rail, an outer rail and a slide coupler, wherein the outer rail of the second rail assembly is mounted on the top panel of the housing, the inner rail of the second rail assembly is mounted on the top plate of the frame; and
    a second rotation shaft assembly connected with the inner rail of the second rail assembly and the top plate of the frame.

8. The equipment cabinet according to claim 6, wherein the rack assembly further comprises:
    a second slidable tray configured to carry the frame to move;
    at least two second rail assemblies, connected with the second slidable tray and the housing respectively and configured for allowing the second slidable tray to be moved relative to the housing;
    a second rotation shaft assembly coupled with the top plate of the frame and the second slidable tray and configured for allowing the frame to be rotated relative to the second slidable tray after the frame carried by the second slidable tray is drawn out.

9. The equipment cabinet according to claim 8, wherein the second rail assembly has a structure the same with that of the first rail assembly, and the second rotation shaft assembly has a structure the same with that of the first rotation shaft assembly.

10. The equipment cabinet according to claim 1, wherein the first rotation shaft assembly comprises:
    a rotation disc base mounted on the first slidable tray and having a cylindrical receptacle;
    a connection part mounted on the base plate of the frame and having a shaft, wherein the shaft is accommodated within the cylindrical receptacle of the rotation disc base and cooperated with the cylindrical receptacle of the rotation disc base; and
    a rolling element disposed between the shaft of the connection part and the cylindrical receptacle of the rotation disc base for allowing the shaft to be rotated relative to the rotation disc base.

11. The equipment cabinet according to claim 1, wherein the housing has a protrusion part having a fixing hole, and the first slidable tray comprises a fixing screw mounted on a third side thereof and corresponding to the fixing hole of the protrusion part.

12. The equipment cabinet according to claim 1, wherein the first slidable tray further comprises a guiding slot connected with the first position-limiting element and the second position-limiting element for guiding the latching device to move between the first position-limiting element and the second position-limiting element.

13. The equipment cabinet according to claim 12, wherein the first position-limiting element and the second position-limiting element are through holes and the guiding slot is a curved guiding slot.

14. The equipment cabinet according to claim 1, wherein the housing further comprises a locking bracket, and the frame further comprises at least one roller corresponding to the locking bracket, wherein when the frame is pushed into the housing via the first slidable tray, the roller of the frame is received in a groove of the locking bracket and movable along the groove of the locking bracket.

15. The equipment cabinet according to claim 1, wherein the rack assembly further comprises an auxiliary rail assembly, connected with the first slidable tray and the housing respectively and configured for allowing the first slidable tray to be moved relative to the housing, wherein the auxiliary rail assembly has a structure the same with that of the first rail assembly.

16. A slidable-and-rotatable rack assembly for an equipment cabinet, wherein the equipment has a housing having a receiving space for receiving the slidable-and-rotatable rack assembly, the slidable-and-rotatable rack assembly comprising:
a first slidable tray;
at least two first rail assemblies, connected with the first slidable tray and the housing respectively and configured for allowing the first slidable tray to be moved relative to the housing;
a frame carried by the first slidable tray and having a base plate; and
a first rotation shaft assembly coupled with the base plate of the frame and the first slidable tray and configured for allowing the frame to be rotated relative to the first slidable tray after the frame carried by the first slidable tray is drawn out,
wherein the first slidable tray further comprises a first position-limiting element and a second position-limiting element, and the frame further comprises a latching device, wherein when the latching device is engaged with the first position-limiting element, the frame is limited to be rotated relative to the first slidable tray, and when the latching device is moved and engaged with the second position-limiting element, the frame is rotated relative to the first slidable tray at a specific angle.

17. The slidable-and-rotatable rack assembly according to claim 16, wherein the frame further includes a first vertical plate, a second vertical plate and a top plate, the first vertical plate is connected with the base plate and the top plate, the second vertical plate is connected with the base plate and the top plate, and the first vertical plate and the second vertical plate are spaced apart and parallel with each other.

18. The slidable-and-rotatable rack assembly according to claim 17, wherein each of the first rail assemblies is a telescopic rail assembly and comprises an inner rail, an outer rail and a slide coupler, wherein the inner rails of the first rail assemblies are mounted on a first side and a second side of the first slidable tray respectively, the outer rails are mounted on two first supporting brackets of the housing respectively or mounted on a first lateral panel and a second lateral panel of the housing respectively, and the slide coupler is disposed between the inner rail and the outer rail and slidable relative to the inner rail and the outer rail.

19. The slidable-and-rotatable rack assembly according to claim 17, further comprising:
a second rail assembly comprising an inner rail, an outer rail and a slide coupler, wherein the outer rail of the second rail assembly is mounted on a top panel of the housing, the inner rail of the second rail assembly is mounted on the top plate of the frame; and
a second rotation shaft assembly connected with the inner rail of the second rail assembly and the top plate of the frame.

20. The slidable-and-rotatable rack assembly according to claim 17, further comprising:
a second slidable tray configured to carry the frame to move;
at least two second rail assemblies, connected with the second slidable tray and the housing respectively and configured for allowing the second slidable tray to be moved relative to the housing;
a second rotation shaft assembly coupled with the top plate of the frame and the second slidable tray and configured for allowing the frame to be rotated relative to the second slidable tray after the frame carried by the second slidable tray is drawn out.

21. The slidable-and-rotatable rack assembly according to claim 17, wherein the first rotation shaft assembly comprises:
a rotation disc base mounted on the first slidable tray and having a cylindrical receptacle;
a connection part mounted on the base plate of the frame and having a shaft, wherein the shaft is accommodated within the cylindrical receptacle of the rotation disc base and cooperated with the cylindrical receptacle of the rotation disc base; and
a rolling element disposed between the shaft of the connection part and the cylindrical receptacle of the rotation disc base for allowing the shaft to be rotated relative to the rotation disc base.

22. The slidable-and-rotatable rack assembly according to claim 16, wherein the first slidable tray further comprises a guiding slot connected with the first position-limiting element and the second position-limiting element for guiding the latching device to move between the first position-limiting element and the second position-limiting element.

* * * * *